(12) United States Patent
Konishi et al.

(10) Patent No.: US 7,511,315 B2
(45) Date of Patent: Mar. 31, 2009

(54) SEMICONDUCTOR DEVICE AND MANUFACTURING METHOD THEREFOR

(75) Inventors: Satoru Konishi, Saku (JP); Tsuneo Endo, Komoro (JP); Hirokazu Nakajima, Saku (JP); Yasunari Umemoto, Sayama (JP); Satoshi Sasaki, Takasaki (JP); Chushiro Kusano, Niiza (JP); Yoshinori Imamura, Sagamiko (JP); Atsushi Kurokawa, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 493 days.

(21) Appl. No.: 11/108,729

(22) Filed: Apr. 19, 2005

(65) Prior Publication Data

US 2005/0258452 A1    Nov. 24, 2005

(30) Foreign Application Priority Data

May 12, 2004  (JP)  ............................. 2004-142506

(51) Int. Cl.
*H01L 21/00*  (2006.01)
*H01L 29/34*  (2006.01)
*H01L 23/48*  (2006.01)
*H01L 21/4763*  (2006.01)

(52) U.S. Cl. .............. 257/108; 257/183; 257/706; 257/707; 257/737; 257/778; 438/108; 438/613; 438/122

(58) Field of Classification Search .............. 257/778, 257/737–738, 706–707, 183, 108; 438/108, 438/613, 122, 235

See application file for complete search history.

(56) References Cited

U.S. PATENT DOCUMENTS

| | | | | |
|---|---|---|---|---|
| 5,349,239 A * | 9/1994 | Sato | ........................... | 257/737 |
| 5,734,193 A * | 3/1998 | Bayraktaroglu et al. | ..... | 257/579 |
| 5,831,337 A * | 11/1998 | Sato | ........................... | 257/780 |
| 6,127,716 A * | 10/2000 | Morizuka et al. | ........... | 257/503 |
| 6,236,266 B1 * | 5/2001 | Choumei et al. | ............ | 330/133 |
| 6,849,478 B2 * | 2/2005 | Cho et al. | ................... | 438/108 |
| 7,067,857 B2 * | 6/2006 | Mochizuki et al. | .......... | 257/197 |
| 7,084,708 B2 * | 8/2006 | Sugiura et al. | .............. | 330/302 |

FOREIGN PATENT DOCUMENTS

JP    2001-244274    9/2001

* cited by examiner

*Primary Examiner*—Howard Weiss
*Assistant Examiner*—Steven H Rao
(74) *Attorney, Agent, or Firm*—Mattingly, Stanger, Malur & Brundidge, P.C.

(57) ABSTRACT

A semiconductor device has an external wiring for GND formed over an underside surface of a wiring substrate. A plurality of via holes connecting to the external wiring for GND are formed to penetrate the wiring substrate. A first semiconductor chip of high power consumption, including HBTs, is mounted over a principal surface of the wiring substrate. The emitter bump electrode of the first semiconductor chip is connected in common with emitter electrodes of a plurality of HBTs formed in the first semiconductor chip. The emitter bump electrode is extended in a direction in which the HBTs line up. The first semiconductor chip is mounted over the wiring substrate so that a plurality of the via holes are connected with the emitter bump electrode. A second semiconductor chip lower in heat dissipation value than the first semiconductor chip is mounted over the first semiconductor chip.

16 Claims, 15 Drawing Sheets

SEMICONDUCTOR DEVICE AND MANUFACTURING METHOD THEREFOR

CROSS-REFERENCE TO RELATED APPLICATION

The present application claims priority from Japanese patent application No. 2004-142506 filed on May 12, 2004, the content of which is hereby incorporated by reference into this application.

BACKGROUND OF THE INVENTION

The present invention relates to a semiconductor device and a manufacturing technique for the semiconductor device, and more particularly to a technology effectively applicable to a semiconductor device including HBTs (Heterojunction Bipolar Transistors) and a manufacturing technique for the semiconductor device.

For example, there are semiconductor elements using III-V compound semiconductor such as gallium arsenide (GaAs). The compound semiconductor is characterized in that it is higher in mobility than silicon (Si) and half-insulating crystals are obtained. In the compound semiconductor, mixed crystals can created, and heterojunctions can be formed.

One of semiconductor elements using heterojunction is heterojunction bipolar transistor (hereafter, referred to as "HBT"). The HBT is a bipolar transistor using gallium arsenide for its base layer, and indium gallium phosphate (In-GaP), aluminum gallium arsenide (AlGaAs), or the like for its emitter layer. That is, the HBT is a bipolar transistor in which a heterojunction is formed using different semiconductor materials for the base layer and for the emitter layer.

The heterojunction makes it possible to make the forbidden band width of the emitter in a base-emitter junction larger than the forbidden band width of the base. Thus, it is possible to significantly increase carrier injection from emitter to base as compared with reverse charge carrier injection from base to emitter. Therefore, the HBT is characterized in that its current amplification factor is very large.

Since the HBT is very large in current amplification factor, as mentioned above, it is used in, for example, high-frequency amplifying systems (power amplifier modules) incorporated in cellular phones. In the power amplifier module, semiconductor chips in which HBTs are formed are mounted over a wiring substrate.

Patent Document 1 discloses a technology that implements the following: when a semiconductor chip with HBTs formed therein is mounted over a wiring substrate, pressure applied to the electrodes of the HBTs is reduced; further, lead-out electrodes and a package substrate (wiring substrate) are brought into contact with each other without fail for the enhancement of the reliability of the semiconductor device.

A more specific description will be given. An emitter lead-out electrode with which the emitter electrodes of a plurality of HBTs are connected in common is formed. In this emitter lead-out electrode, a dent is formed in the areas positioned above the individual emitter electrodes. Thus, during flip chip mounting during which the emitter lead-out electrode is brought into contact with the package substrate, the dents prevent bonding pressure from being applied to the emitter electrodes.

[Patent Document 1] Japanese Unexamined Patent Publication No. 2001-244274 (pp. 5 to 6, FIG. 5)

SUMMARY OF THE INVENTION

Recently, many electronic components have been incorporated into communication terminal equipment such as cellular phones. With respect to power amplifier modules, which are incorporated into the transmission units of cellular phones, downsizing and enhancement of functions are rapidly moving ahead.

Examples of transmission methods for cellular phones include CDMA (Code Division Multiple Access) and GSM (Global System for Mobile Communication). In the field of CDMA, especially, the dimensions of power amplifier modules are 6 mm long and 6 mm wide. In the next generation of power amplifier modules, those with the size of 4 mm long and 4 mm wide are expected to go mainstream. In the field of GSM, similarly, there is a demand that the size should be reduced with the present functions maintained. As downsizing of power amplifier modules progresses, as mentioned above, it is becoming difficult to ensure wire bond regions where a semiconductor chip and a wiring substrate are electrically connected with each other.

HBTs are used in, for example, power amplifier modules incorporated in cellular phones, as mentioned above. The power amplifier modules include, for example, three-staged amplifier circuits and a control circuit that controls these amplifier circuits. HBTs are used in amplifier circuits in the last stage (in the third stage) requiring a high amplification factor, of the amplifier circuits in the three stages.

The three-staged amplifier circuits and the control circuit included in a power amplifier module are not formed in one semiconductor chip but are separately formed in two semiconductor chips. A more specific description will be given. The amplifier circuits in the second stage and the last stage are formed in a first semiconductor chip formed of compound semiconductor; the control circuit and the amplifier circuits in the first stage are formed in a second semiconductor chip formed of silicon. The first semiconductor chip and the second semiconductor chip are two-dimensionally (planarly) mounted over a wiring substrate, and are electrically connected with the wiring substrate by wire bonding.

Therefore, the above-mentioned planar structure poses a problem: it is difficult to reduce the size of a power amplifier module.

The first semiconductor chip with HBTs formed therein is mounted with its surface opposite its element formation surface facing toward the wiring substrate. That is, the first semiconductor chip is mounted face up, or with its element formation surface facing upward. For this reason, heat produced in elements such as HBTs passes through the first semiconductor chip and is conducted to the backside of the first semiconductor chip. After the heat is thereafter conducted to the wiring substrate, the heat passes through heat radiation via holes so formed that they penetrate the wiring substrate. Then the heat is conducted to the backside of the wiring substrate and radiated there.

The first semiconductor chip is formed of compound semiconductor, which is inferior in thermal conductivity to silicon. In other words, the compound semiconductor is inferior in the efficiency of radiation of heat produced in elements such as HBTs. To enhance the heat radiation efficiency, the thickness of the first semiconductor chip must be reduced to approximately 80 µm, which leads to the increased cost of the first semiconductor chip. There is another problem: thinned first semiconductor chips are difficult to handle.

An object of the present invention is to provide a semiconductor device whose size can be reduced.

Another object of the present invention is to provide a semiconductor device with enhanced heat radiation efficiency.

The above and other related objects and novel features of the present invention will be apparent from the description in this specification and the accompanying drawings.

The following is a brief description of the gist of the representative elements of the invention laid open in this application.

A semiconductor device of the present invention comprises: a first semiconductor chip having (a1) a plurality of heterojunction bipolar transistors, and (a2) an emitter bump electrode with which the emitter electrodes of a plurality of the heterojunction bipolar transistors are connected in common and which is extended in a predetermined direction; and (b) a wiring substrate over which the first semiconductor chip is mounted. The emitter bump electrode is connected with a plurality of via holes formed so that the via holes penetrate the wiring substrate.

A manufacturing method for semiconductor devices of the present invention comprises the steps of: (a) forming a plurality of heterojunction bipolar transistors in chip regions of a semiconductor wafer; (b) forming emitter wiring with which emitter electrodes of a plurality of the heterojunction bipolar transistors are connected in common; (c) forming an emitter bump electrode extended over the emitter wiring; (d) separating the semiconductor wafer into individual first semiconductor chips; and (e) mounting the first semiconductor chip over a wiring substrate. The step (e) above is such that the first semiconductor chip is mounted over the wiring substrate so that the emitter bump electrode formed in the first semiconductor chip is connected with a plurality of the via holes formed in the wiring substrate.

The following is a brief description of the gist of the effects obtained by the representative elements of the invention laid open in this application.

Semiconductor devices can be reduced in size. The heat radiation efficiency of semiconductor devices can be enhanced.

DETAILED DESCRIPTION OF THE PREFERRED EMBODIMENT

In the following description of the embodiment, it will be divided into a plurality of sections or embodiments if necessary for the sake of convenience. However, they are not regardless of each another, but are in such a relation that one is a modification to, the details of, the supplementary explanation of, or the like of part or all of the other unless otherwise stated.

If reference is made to any number of elements or the like (including number of pieces, numeric value, quantity, range, and the like) in the description of the embodiment below, the present invention is not limited by that value. The number may be greater or less than the value. However, the following cases are excepted: cases where some number is explicitly specified, cases where some number is evidently limited to a specific value in principle, and the like cases.

In the embodiment described below, needless to add, their components (including constituent steps and the like) are not necessarily indispensable. However, the following cases are excepted: cases where some component is explicitly specified, cases where some component is deemed to be evidently indispensable in principle, and the like cases.

Similarly, if reference is made to the shape, positional relationship, or the like of any component or the like in the description of the embodiment below, those substantially approximate or analogous to that shape or the like are included. However, the following cases are excepted: cases where exclusion of some shape or the like is explicitly specified, cases where some shape or the like is deemed to be evidently excluded in principle. This is the same with the above-mentioned numeric values and ranges.

In every drawing for illustrating the embodiment, members having the same functions will be marked with the same numerals, and the repetitive description of them will be omitted.

Hereafter, detailed description will be given to the embodiment of the present invention with reference to drawings.

This embodiment is, for example, a power amplifier module (semiconductor device) incorporated in a cellular phone to which the present invention is applied.

Figure 1:
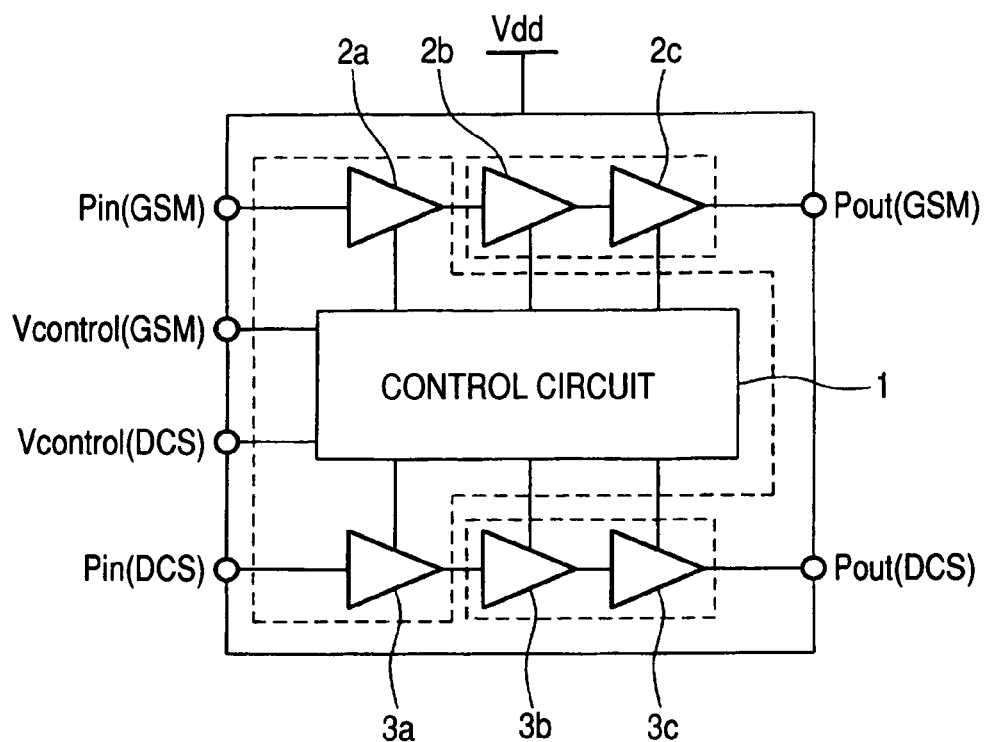
FIG. 1 illustrates the circuit block of a high-frequency amplifier in an embodiment of the present invention.

FIG. 1 illustrates the circuit block of the high-frequency amplifier of the power amplifier module in this embodiment. A description will be given to the circuit block of the high-frequency amplifier with reference to FIG. 1. In FIG. 1, the high-frequency amplifier comprises a control circuit 1, amplifiers 2a to 2c, and amplifiers 3a to 3c. This high-frequency amplifier is so constructed that it can amplify signals in two different frequency bands. A more specific description will be given. The amplifiers in one group are of the GSM (Global System for Mobile Communication) type, utilizing a first frequency, and can amplify signals using a frequency band of 880 MHz to 915 MHz. The amplifiers in the other group are of the DCS (Digital Communication System 1800) type, utilizing a second frequency, and can amplify signals using a frequency band of 1710 MHz to 1785 MHz.

The control circuit 1 placed in the above-mentioned high-frequency amplifier is so constructed that it is fed with control signals and controls the amplifiers 2a to 2c and the amplifiers 3a to 3c based on the inputted control signals. This control circuit 1 can be separately fed with control signals ($V_{control}$ (GSM)) for controlling the amplifiers 2a to 2c and control signals ($V_{control}$ (DCS)) for controlling the amplifiers 3a to 3c. The control circuit 1 is so constructed that when the amplifiers 2a to 2c are used, it controls them based on $V_{control}$ (GSM), and when the amplifiers 3a to 3c are used, it controls them based on $V_{control}$ (DCS). Thus, the high-frequency amplifier in this embodiment controls the amplification of signals in two different frequency bands. The control circuit 1 is formed of, for example, MOSFETs (Metal Oxide Semiconductor Field Effect Transistors) and the like.

The amplifiers 2a to 2c (first circuit) are so constructed that they are fed with input power (input signals) of the GSM $P_{in}$ (GSM) and amplify the input power $P_{in}$ (GSM) in three stages. More specifically, the input power $P_{in}$ (GSM) is amplified at the amplifier 2a first, and then the power amplified at the amplifier 2a is amplified at the amplifier 2b. The power amplified at the amplifier 2b is amplified at the amplifier 2c in the last stage, and then it is outputted from the high-frequency amplifier. As mentioned above, the amplifiers 2a to 2c are so constructed that they can amplify power of the GSM.

The amplifying portion (amplifier circuit) of the amplifier 2a used in the first stage, of the amplifiers 2a to 2c, is required to reduce noise, and is formed of, for example, MOSFET. The amplifying portion (amplifier circuit) of the amplifier 2c used in the last stage is required to offer a high amplification factor, and thus formed of, for example, HBT. For this reason, the power consumption of the control circuit 1 and the amplifier 2a in the first stage is several tens of milliwatts, while the power consumption of the amplifier 2c used in the last stage is several watts. For the amplifier 2b used in the middle stage, for example, either MOSFET or HBT may be used, and its power consumption is several hundreds of milliwatts.

Similarly, the amplifiers 3a to 3c (second circuit) are so constructed that they are fed with input power (input signal) of the DCS $P_{in}$ (DCS) and amplify the input power in three stages. More specifically, the input power Pin (DCS) is amplified at the amplifier 3a and then amplified at the amplifier 3b. Subsequently, the power amplified at the amplifier 3b is further amplified at the amplifier 3c, and then it is outputted from the high-frequency amplifier. As mentioned above, the amplifiers 3a to 3c are so constructed that they can amplify power of the DCS.

Similarly with the above-mentioned amplifiers 2a to 2c, the amplifying portion of the amplifier 3a used in the first stage is formed of, for example, MOSFET; the amplifying portion of the amplifier 3c used in the last stage is formed of, for example, HBT.

The thus constructed high-frequency amplifier is not formed in one chip but is divided and formed in two chips. A more specific description will be given. The amplifying portions of the amplifiers 2b, 2c, 3b, and 3c in the second and last stages, relatively high in heat dissipation value, are formed in the first semiconductor chip formed of compound semiconductor; the control circuit 1 and the amplifying portions of the amplifiers 2a and 3a in the first stages, relatively low in heat dissipation value, are formed in the second semiconductor chip.

Figure 2:
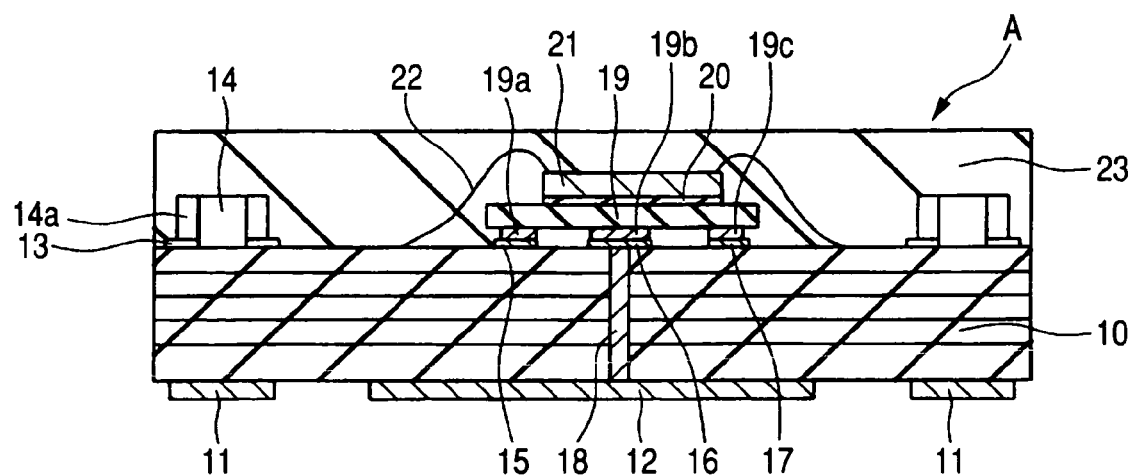
FIG. 2 is a sectional view illustrating the structure of a power amplifier module.

A description will be given to the structure of the power amplifier module A including the above-mentioned high-frequency amplifier. FIG. 2 is a sectional view illustrating the structure of the power amplifier module A in this embodiment. First, consideration will be given to the apparent structure of the power amplifier module A as a semiconductor device in this embodiment, with reference to FIG. 2. The power amplifier module A comprises: a rectangular wiring substrate 10; a sealing portion 23 so formed that it covers the surface (principal surface) of the wiring substrate 10; and a plurality of external wirings 11 and an external wiring for GND (ground level voltage supply) 12 formed over the backside of the wiring substrate 10.

The power amplifier module A is assembled as follows: electronic components including semiconductor chips are mounted over a substrate having multiple segments in which a plurality of ranked wiring substrates 10 are formed. Thereafter, a sealing portion 23 having a certain height is formed of resin so that the mounted electronic components are covered therewith. The substrate having multiple segments with the sealing portion 23 formed thereover is vertically and horizontally cut and separated to form a plurality of power amplifier modules A at a time. Thus, the power amplifier module A is so structured that the side surfaces of each wiring substrate 10 are flush with the side surfaces of its sealing portion 23; and the ends of the sealing portion 23 are not positioned outside the ends of the wiring substrate 10.

The wiring substrate 10 is formed of, for example, a printed wiring substrate, and is so structured that a plurality of dielectric layers (insulating layers) are bonded together. The wiring substrate 10 has predetermined wirings formed over its surface (principal surface) and underside surface and in its interior. Some of the wirings formed over the surface of the wiring substrate 10 and some of the wirings formed over the underside surface of the wiring substrate 10 are electrically connected with each other. This connection is provided by via holes 18 that are extended in the direction of the thickness of the wiring substrate 10. This embodiment includes the five dielectric layers. Needless to add, the present invention is not limited to this.

A detailed description will be given to the constitution of the power amplifier module A. In FIG. 2, wirings 13 and 15 to 17 are formed over the surface of the wiring substrate 10 of the power amplifier module A, and a chip component 14 is so formed that it is connected with the wiring 13. The chip component 14 comprises, for example, passive components such as resistor, inductance element, and capacitor. The chip component 14 is electrically connected with the wiring 13, formed over the surface of the wiring substrate 10, through connecting terminals 14a. The passive components used in this chip component 14 are, for example, matching circuits and capacitors provided in the amplifiers 2a to 2c illustrated in FIG. 1. For example, the input portion of the amplifier 2a is connected in series with a matching circuit and a capacitor, and this capacitor is connected with the gate electrode of MOSFET present in the amplifying portion (amplifier circuit). With respect to the amplifier 2c provided with HBT as an amplifying portion, its input portion is connected in series with a matching circuit and a capacitor. This capacitor is connected with the base electrode of HBT present in the amplifying portion (amplifier circuit).

The matching circuits are microstrip lines that function as, for example, inductance elements for providing impedance matching between the amplifier 2a to the amplifier 2c. The capacitors respectively connected in series with the matching circuits are provided with, for example, a function of interrupting the direct-current voltage of supply voltage and gate bias voltage.

The wirings 16 are connected to the external wiring for GND (ground level voltage supply) 12, formed over the underside surface of the wiring substrate 10, through the via holes 18 formed in the wiring substrate 10. The via holes 18 are formed of conductor such as metal, for example, alloy of copper and tungsten.

The first semiconductor chip 19 is mounted over the surface of the wiring substrate 10, and the second semiconductor chip 21 is mounted over the first semiconductor chip 19 through adhesive 20. A more specific description will be given. A collector bump electrode 19a, an emitter bump electrode 19b, and a base bump electrode 19c are formed in the first semiconductor chip 19. The first semiconductor chip 19 is electrically connected with the wirings 15 to 17, formed over the surface of the wiring substrate 10, through the collector bump electrode 19a, emitter bump electrode 19b, and base bump electrode 19c. For example, the collector bump electrode 19a is electrically connected with the wiring 15, and the emitter bump electrode 19b is electrically connected with the wirings 16. Therefore, the emitter bump electrode 19b is connected with the external wiring for GND (ground level voltage supply) 12, formed over the underside surface of the wiring substrate 10, through the wirings 16 and the via holes 18.

Thus the first semiconductor chip 19 is mounted over the wiring substrate 10 with its element formation surface facing downward (face down). The second semiconductor chip 21 is mounted over the surface (upper surface) of the first semiconductor chip 19, opposite its surface that faces toward the wiring substrate 10 when the first semiconductor chip 19 is mounted over the wiring substrate 10, through the adhesive 20. The second semiconductor chip 21 is mounted with its element formation surface facing upward (face up), and the second semiconductor chip 21 and the wiring substrate 10 are connected with each other through wires 22. In this embodiment, the power amplifier module A has the sealing portion 23 of resin so formed that the chip component 14, first semiconductor chip 19, and second semiconductor chip 21, formed over the wiring substrate 10, are covered therewith.

The amplifying portions of the amplifiers 2b and 3b in the second stages and the amplifiers 2c and 3c in the last stage of the circuits illustrated in FIG. 1 are formed in the first semiconductor chip 19. That is, the amplifying portions of the amplifiers 2b and 2c that operate with the first frequency (GSM type) and the amplifying portions of the amplifiers 3b and 3c that operate with the second frequency (DCS type) are formed there. As mentioned above, the first semiconductor chip 19 is formed of compound semiconductor, and HBTs are used in the amplifiers 2c and 3c. For this reason, the power consumption of the first semiconductor chip 19 is relatively large, and thus its heat dissipation value is also relatively high.

As illustrated in FIG. 2, the collector bump electrode 19a, emitter bump electrode 19b, and base bump electrode 19c are formed in the first semiconductor chip 19. For example, the collector bump electrode 19a is connected with the collector electrodes of a plurality of the HBTs in common; the emitter bump electrode 19b is connected with the emitter electrodes of a plurality of the HBTs in common. The base bump electrode 19c is connected with, for example, the base electrodes of a plurality of the HBTs in common. Therefore, the emitter electrodes of the HBTs are connected with the emitter bump electrode 19b. As a result, the emitter electrodes of the HBTs are connected with the external wiring for GND (ground level voltage supply) 12, formed over the underside surface of the wiring substrate 10, through the emitter bump electrode 19b and the via holes 18.

As mentioned above, the first semiconductor chip 19 is mounted face down over the wiring substrate 10, and further the emitter electrodes of the HBTs are connected with the external wiring for GND (ground level voltage supply) 12 through the emitter bump electrode 19b and the via holes 18. Thus, the efficiency of radiation of heat produced in the HBTs can be enhanced.

Conventionally, semiconductor chips formed of compound semiconductor with HBTs formed therein are mounted over a wiring substrate with their element formation surfaces facing upward. That is, they are mounted face up. For this reason, heat produced in the HBTs goes from the principal surface of the semiconductor chip, passes through the semiconductor chip formed of compound semiconductor, and is conducted to the backside of the semiconductor chip. (The backside of the semiconductor chip is a surface that faces toward a wiring substrate when the semiconductor chip is mounted over the wiring substrate.) The heat conducted to the backside of the semiconductor chip is conducted to the backside of the wiring substrate through via holes formed in the wiring substrate. In this case, however, a problem arises. The compound semiconductor is inferior in thermal conductivity to silicon. Therefore, thermal conduction from the principal surface to the backside of the semiconductor chip formed of compound semiconductor is poor. To cope with this, the thickness of the semiconductor chip formed of compound semiconductor must be reduced to approximately 80 μm. This increases the cost, and care must be exercised in handing thinned semiconductor chips.

In this embodiment, consequently, the following measures are taken: the first semiconductor chip 19 with a plurality of the HBTs formed therein is mounted face down over the wiring substrate 10. The emitter electrodes of a plurality of the HBTs are connected with the external wiring for GND (ground level voltage supply) 12 through the emitter bump electrode 19b and the via holes 18. Thus, the efficiency of radiation of heat produced in the HBTs is enhanced. A more specific description will be given. Most of heat produced in the HBTs is conducted to the emitter bump electrode 19b through the emitter electrodes. The heat conducted to the emitter bump electrode 19b is conducted to the external electrode for GND (ground level voltage supply) 12, formed over the underside surface of the wiring substrate 10, through the via holes 18, and is radiated there. Thus, this embodiment is so constructed that heat is directly conducted from the element formation surface of the first semiconductor chip 19 to the wiring substrate 10. In other words, the paths from the element formation surface of the first semiconductor chip 19 to the underside surface of the first semiconductor chip 19 are prevented from forming a major path for thermal diffusion. That is, the interior of the first semiconductor chip 19 inferior in thermal conductivity is prevented from forming a major path for thermal diffusion, and the efficiency of radiation of heat produced in the HBTs is thereby enhanced. As a result, it is unnecessary to reduce the ordinary thickness of the first semiconductor chip 19, 160 μm to 200 μm, and increase in cost can be suppressed. At the same time, the first semiconductor chip 19 becomes easy to handle.

The control circuit 1 and the amplifying portions of the amplifiers 2a and 3a in the first stages, of the circuits illustrated in FIG. 1, are formed in the second semiconductor chip 21. That is, the control circuit 1, the amplifying portions of the amplifier 2a that operates with the first frequency (GSM type), and the amplifier 3a that operates with the second frequency (DCS type) are formed there. As mentioned above, the second semiconductor chip 21 is formed of silicon, and MOSFETs are used in the amplifying portions of the amplifiers 2a and 3a. For this reason, the power consumption of the second semiconductor chip 21 is relatively small as compared with the first semiconductor chip 19 with the HBTs formed therein, and thus its heat dissipation value is also relatively low. For example, the heat dissipation value of the second semiconductor chip 21 is approximately ⅕ of the heat dissipation value of the first semiconductor chip.

The thus constructed second semiconductor chip 21 is mounted over the first semiconductor chip 19, as illustrated in FIG. 2. That is, the power amplifier module A in this embodiment is of laminated structure: the first semiconductor chip 19 is mounted over the wiring substrate 10. The second semiconductor chip 21 is mounted over the surface of the first semiconductor chip 19 opposite its surface that faces toward the wiring substrate 10 when the first semiconductor chip 19 is mounted over the wiring substrate 10. This structure in which the first semiconductor chip 19 and the second semiconductor chip 21 are laminated together brings the following advantage: the size of the power amplifier module A can be reduced as compared with the structure in which the first semiconductor chip 19 and the second semiconductor chip 21 are planarly disposed.

The following advantages are brought by mounting the first semiconductor chip 19 with the HBTs formed therein face down: the emitter bump electrode 19b with which the emitter electrodes of a plurality of the HBTs are connected in common is connected with the external electrode for GND (ground level voltage supply) 12 through the via holes 18. The second semiconductor chip 21 is mounted over the first semiconductor chip 19. As a result, the efficiency of radiation of heat from the first semiconductor chip 19 can be enhanced, and the size of the power amplifier module A can be reduced.

Figure 3:
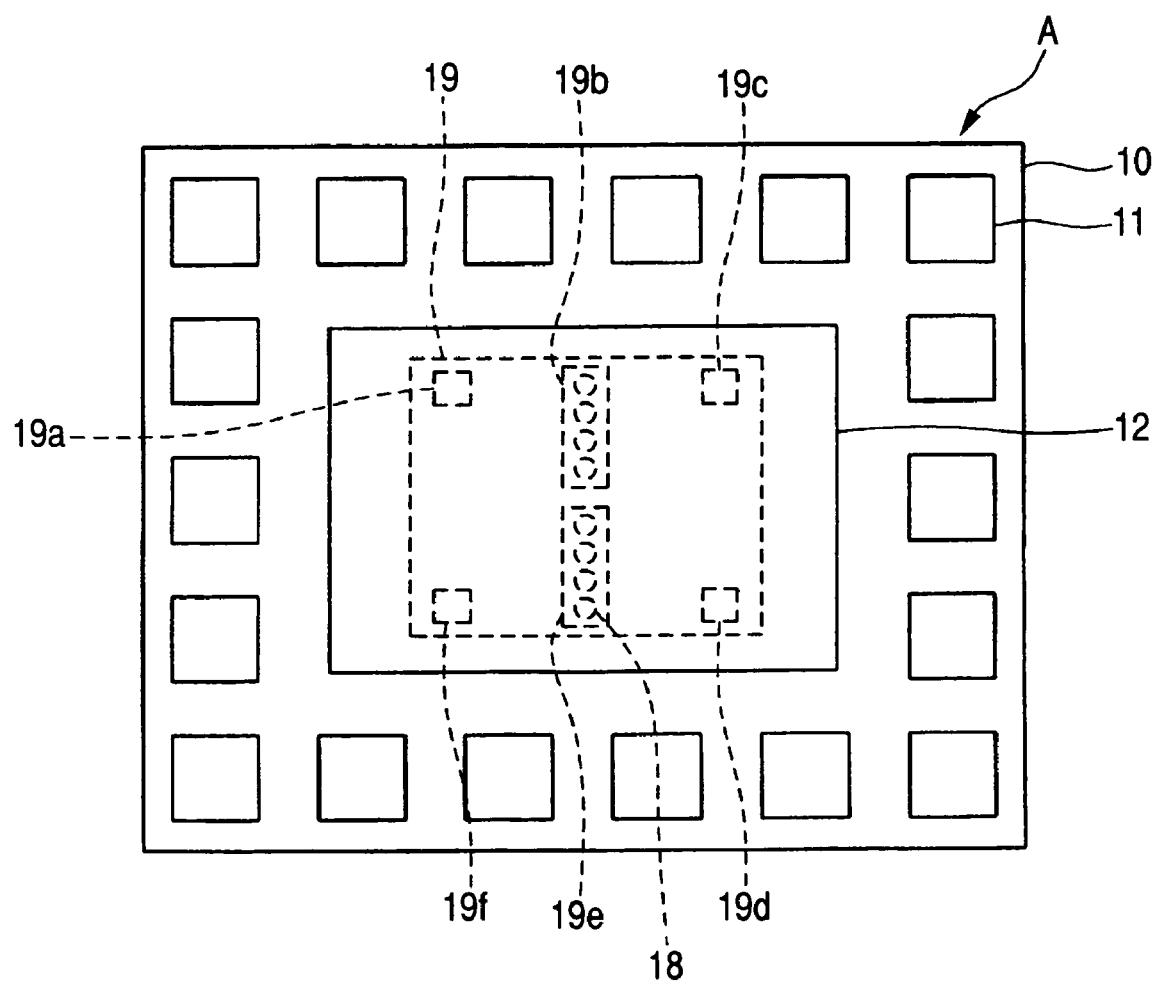
FIG. 3 is a plan view of the power amplifier module viewed from the back side.

FIG. 3 is a plan view of the power amplifier module A having the structure illustrated in FIG. 2, as viewed from the back side. As seen from FIG. 3, the external wirings 11 are formed in the peripheral area of the wiring substrate 10, and the external wiring for GND (ground level voltage supply) 12 is formed substantially in the center of the wiring substrate 10. A plurality of the via holes 18 that are so formed that they are extended from the surface (principal surface) of the wiring substrate 10 in the direction of thickness are connected with the external wiring for GND (ground level voltage supply) 12. That is, a plurality of the via holes 18 that are so formed that they penetrate the wiring substrate 10 from its surface are connected with the external wiring for GND (ground level voltage supply) 12. In the example in FIG. 3, eight via holes 18 in the vertical direction and one via 18 in the horizontal direction, eight via holes 18 in total, are connected with the external wiring for GND (ground level voltage supply) 12.

As illustrated in FIG. 3, the first semiconductor chip 19 is mounted over the surface (principal surface) of the wiring substrate 10 opposite its underside surface. The collector bump electrodes 19a and 19d, emitter bump electrodes 19b and 19e, and base bump electrodes 19c and 19f are formed in the first semiconductor chip 19. Of these electrodes, the emitter bump electrodes 19b and 19e connected with the emitter electrodes of a plurality of the HBTs are so formed that a plurality of the via holes 18 are embraced therein. A more specific description will be given. The emitter bump electrodes 19b and 19e are in substantially rectangular shape, and are connected with a plurality of the via holes (four via holes in the example in FIG. 3). Therefore, heat produced in a plurality of the HBTs is conducted to the emitter bump electrodes 19b and 19e through the individual emitter electrodes. The heat conducted to the emitter bump electrodes 19b and 19e is conducted to the external electrode for GND (ground level voltage supply) 12, formed over the underside surface of the wiring substrate 10, through a plurality of the via holes 18 connected with the bump electrodes 19b and 19e. The heat is then radiated there. As mentioned above, this embodiment is so constructed that a plurality of the via holes 18 are connected with the emitter bump electrodes 19b and 19e. Therefore, heat passes through a plurality of the via holes 18 from the emitter bump electrodes 19b and 19e and is diffused. For this reason, the efficiency of radiation of heat from the power amplifier module A can be enhanced.

Figure 4:
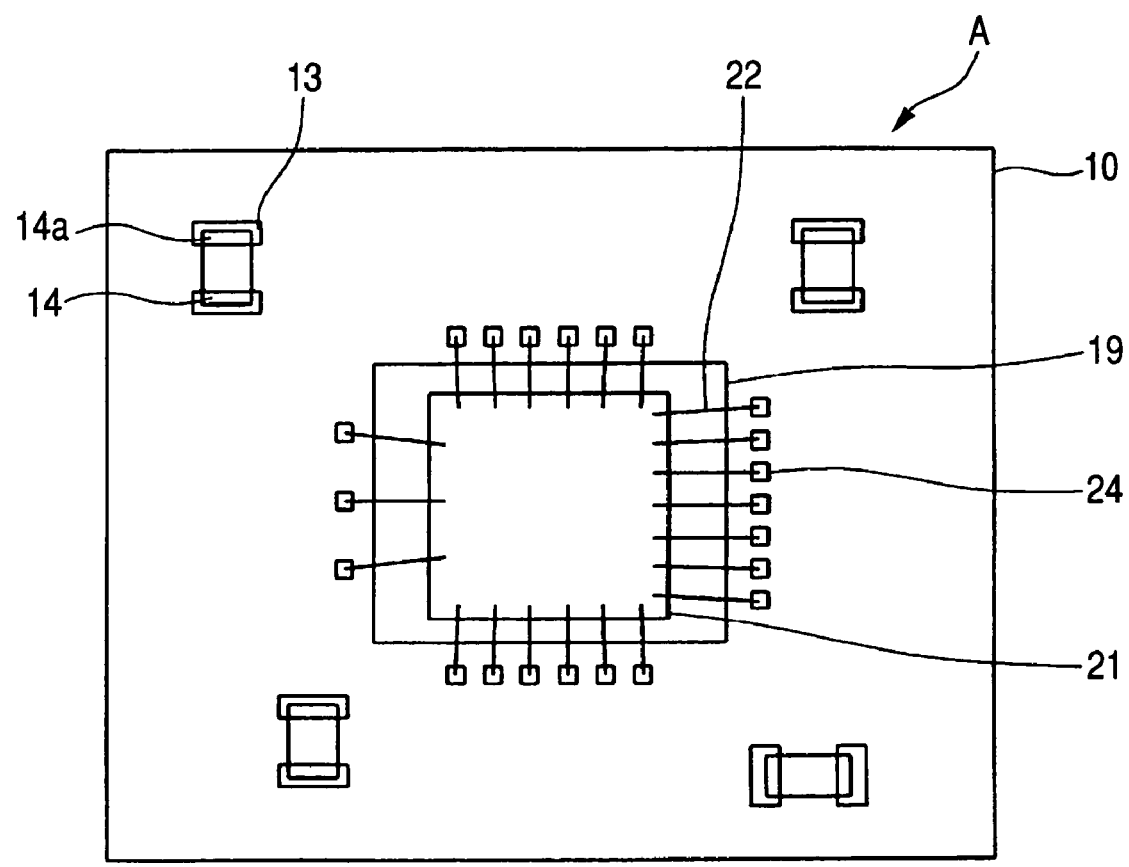
FIG. 4 is a plan view illustrating an example of the disposition of components mounted over the principal surface of a wiring substrate.

FIG. 4 is a plan view illustrating an example of the disposition of components mounted over the surface (principal surface) of the wiring substrate 10. In FIG. 4, a plurality of chip components 14 are mounted over the surface of the wiring substrate 10. The first semiconductor chip 19 is mounted face down in the center of the wiring substrate 10. The second semiconductor chip 21 is mounted over the first semiconductor chip 19. The second semiconductor chip 21 is mounted face up over the first semiconductor chip 19, and the second semiconductor chip 21 and the wiring 24 of the wiring substrate are electrically connected with wires 22.

Figure 5:
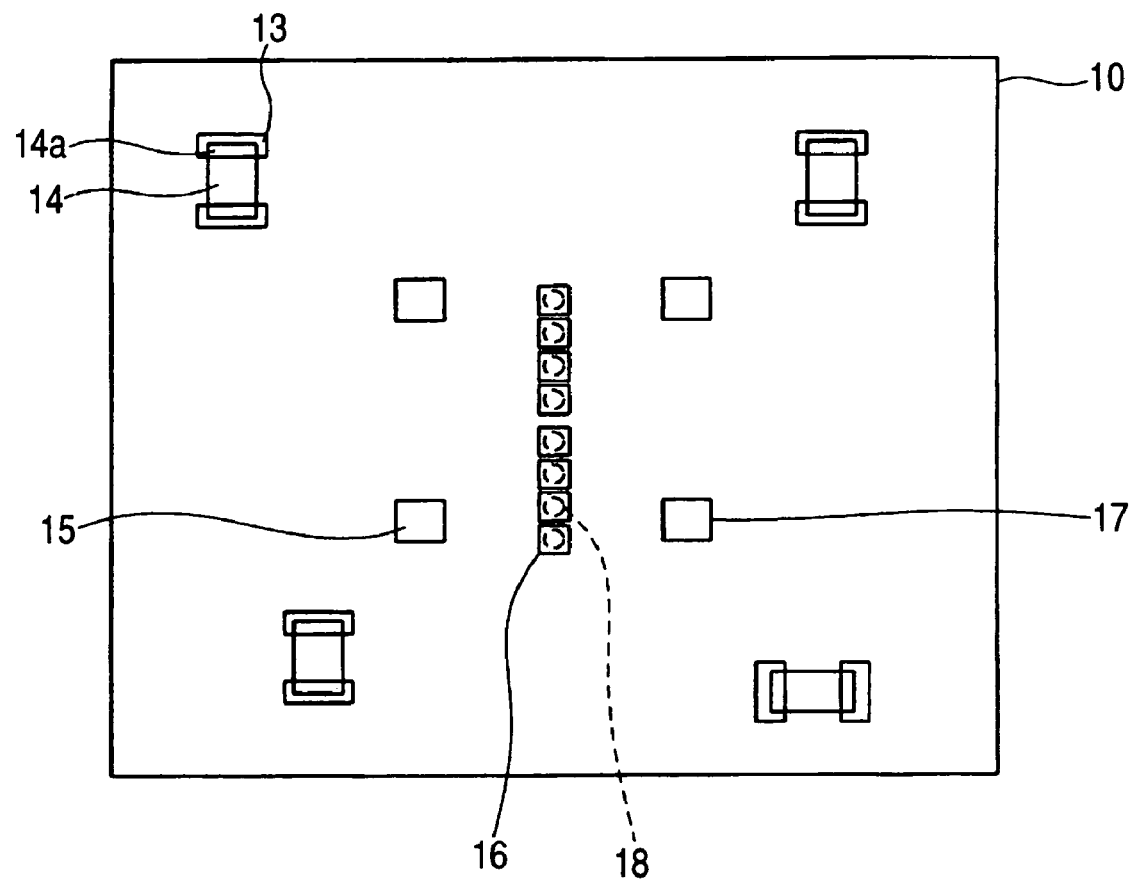
FIG. 5 is a plan view showing the principal surface of the wiring substrate, illustrating an example of a state in which neither a first semiconductor chip nor a second semiconductor chip is mounted.

FIG. 5 is a drawing illustrating the principal surface of the wiring substrate 10, and it is a plan view illustrating an example of a state in which neither the first semiconductor chip 19 or the second semiconductor chip 21 is mounted. As illustrated in FIG. 5, wiring 15 to wiring 17 are formed in the center of the wiring substrate 10. The wiring 15 to the wiring 17 are so formed that they are connected with the collector bump electrode 19a, emitter bump electrode 19b, and base bump electrode 19c formed in the first semiconductor chip 19. The wirings 16 are connected with the via holes 18, and are connected with the external wiring for GND (ground level voltage supply) 12 formed over the underside surface of the wiring substrate 10 through these via holes 18.

Figure 6:
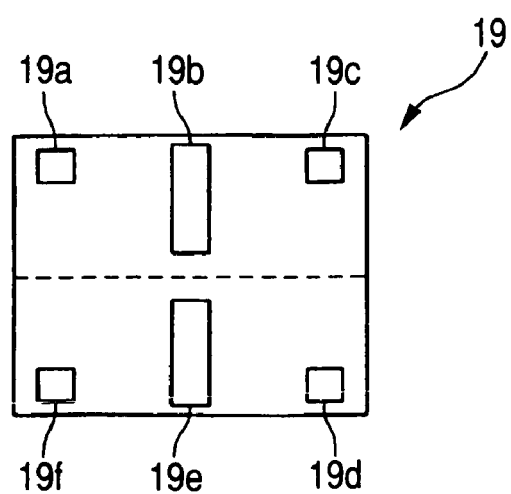
FIG. 6 is a plan view illustrating the element formation surface of the first semiconductor chip in a simplified manner.

FIG. 6 is a plan view illustrating the element formation surface (surface) of the first semiconductor chip 19 in a simplified manner. In FIG. 6, the collector bump electrode 19a, emitter bump electrode 19b, and base bump electrode 19c are formed in the element formation surface of the first semiconductor chip 19. The collector bump electrode 19a, emitter bump electrode 19b, and base bump electrode 19c are respectively connected with the wiring 15 to the wiring 17 of the wiring substrate 10 illustrated in FIG. 5. Especially, the emitter bump electrode 19b is so connected that a plurality of the wirings 16 (a plurality of the via holes 18) are embraced therein. In the area above the broken line in FIG. 6, for example, the amplifiers 2b and 2c supporting the GSM are formed, and the HBTs are used in this amplifier 2c. In the area under the broken line in FIG. 6, for example, the amplifiers 3b and 3c supporting the DCS are formed, and the HBTs are used in this amplifier 3c. That is, the collector bump electrode 19a, emitter bump electrode 19b, and base bump electrode 19c are connected with a plurality of the HBTs used in the GSM; and the collector bump electrode 19d, emitter bump electrode 19e, and base bump electrode 19f are connected with a plurality of the HBTs used in the DCS.

Figure 7:
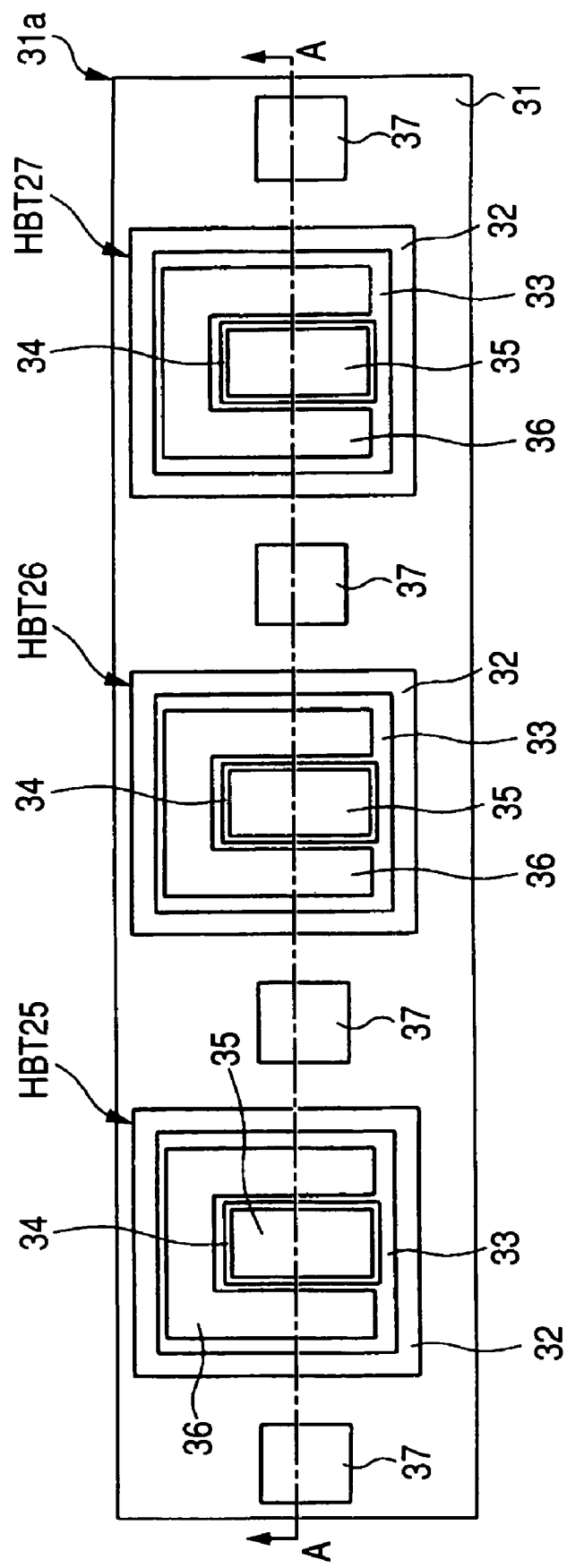
FIG. 7 is a plan view illustrating a plurality of HBTs formed in the first semiconductor chip.

A description will be given to the internal structure of the first semiconductor chip 19. FIG. 7 is a plan view illustrating HBT 25 to HBT 27 formed in the first semiconductor chip 19. In FIG. 7, the HBT 25 to the HBT 27 are formed at predetermined intervals over, for example, a sub collector layer 31 that is isolated from other elements by mesa isolation 31a and comprises an $n^+$-type GaAs layer. The HBT 25 to the HBT 27 are similarly constructed; therefore, description will be given to the construction of the HBT 25 formed, for example, at the left end of the HBT 25 to the HBT 27. The HBT 25 has a collector electrode 37 formed over the sub collector layer 31 and a collector mesa 32 formed at a predetermined distance from the collector electrode 37. The collector electrode 37 is formed of, for example, gold (Au).

The collector mesa 32 is formed of, for example, an n-type GaAs layer, and the collector mesa 32 and the collector electrode 37 are electrically connected with each other through the sub collector layer 31. A base mesa 33 comprising, for example, a p-type GaAs layer is formed over the collector mesa 32.

A base electrode 36 formed of gold or the like is formed in the peripheral region of the base mesa 33. A more specific description will be given. The base electrode 36 in U shape turned upside down is formed over the base mesa 33. An emitter layer 34 is formed substantially in the center over the base mesa 33, and an emitter electrode 35 is formed over the emitter layer 34. For example, the emitter layer 34 is formed of a layer obtained by laminating an n-type InGaP layer, a GaAs layer, and an InGaAs layer, and the emitter electrode 35 is formed of, for example, tungsten silicide (WSi).

Thus, a junction of heterogeneous semiconductors (heterojunction) is formed between the base mesa (p-type GaAs layer) 33 and the emitter layer (n-type InGaP layer) 34. The HBT 25 in this embodiment is of such a structure that the collector electrode 37 is in the lowermost layer, the emitter electrode 35 is formed in the uppermost layer, and the base electrode 36 is formed in the intermediate layer.

The HBT 25 is constructed as mentioned above, and the HBT 26 and the HBT 27 having the same constitution as the HBT 25 are formed side by side.

Figure 8:
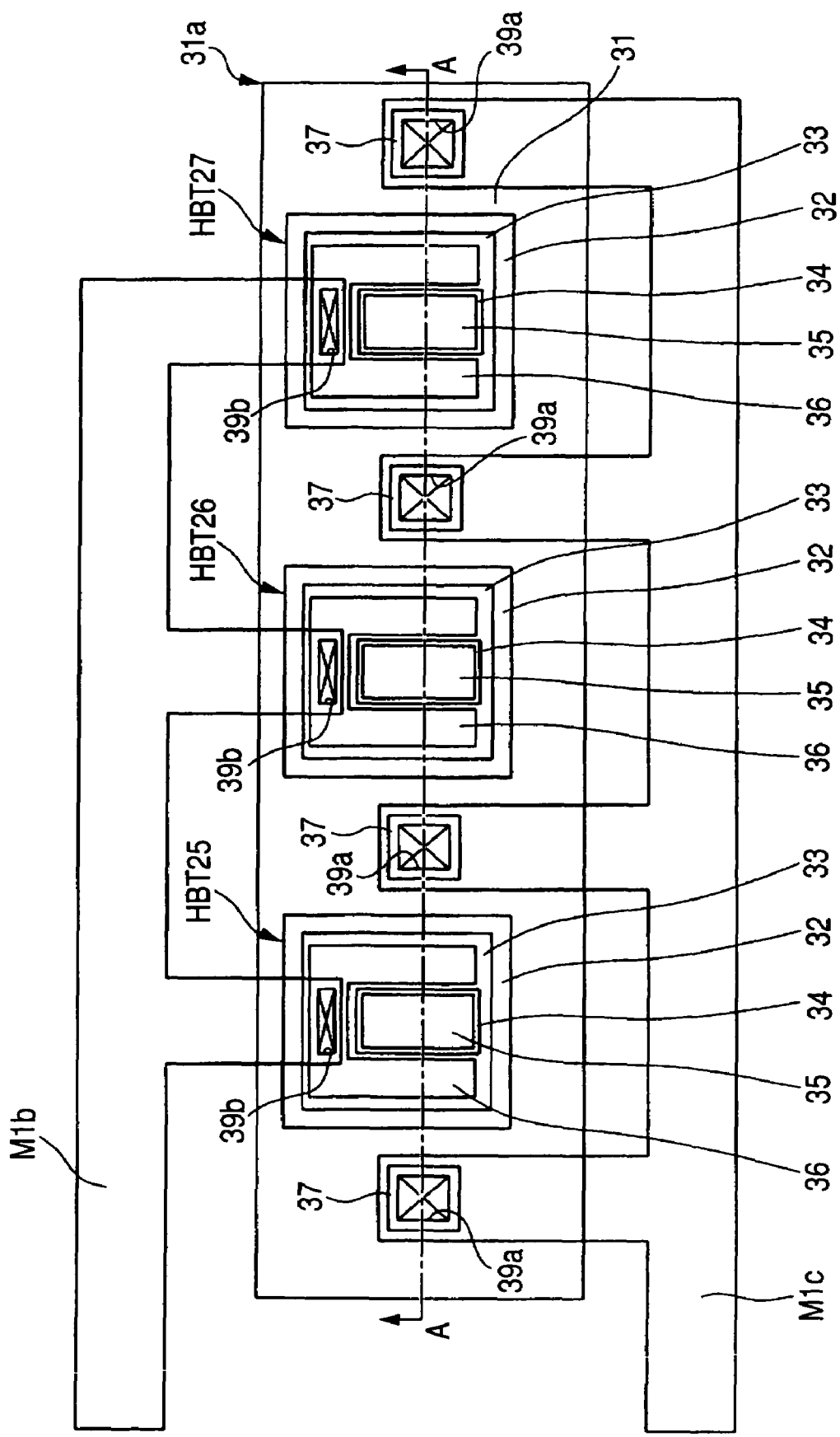
FIG. 8 is a plan view illustrating the way a plurality of the HBTs and a first wiring layer are formed.

FIG. 8 is a plan view illustrating a state in which the HBT 25 to the HBT 27 and the first wiring layer are formed. As illustrated in FIG. 8, the collector electrodes 37 of the HBT 25 to the HBT 27 are connected in common with first collector wiring M1*c* through connection holes 39*a* filled with conductive material. That is, the first collector wiring M1*c* is for electrically connecting the collector electrodes 37 of the HBT 25 to the HBT 27, and is formed in the first wiring layer. The base electrodes 36 of the HBT 25 to the HBT 27 are connected in common with first base wiring M1*b* through connection holes 39*b* filled with conductive material. The first base wiring M1*b* is also formed in the first wiring layer like the first collector wiring M1*c*.

Figure 9:
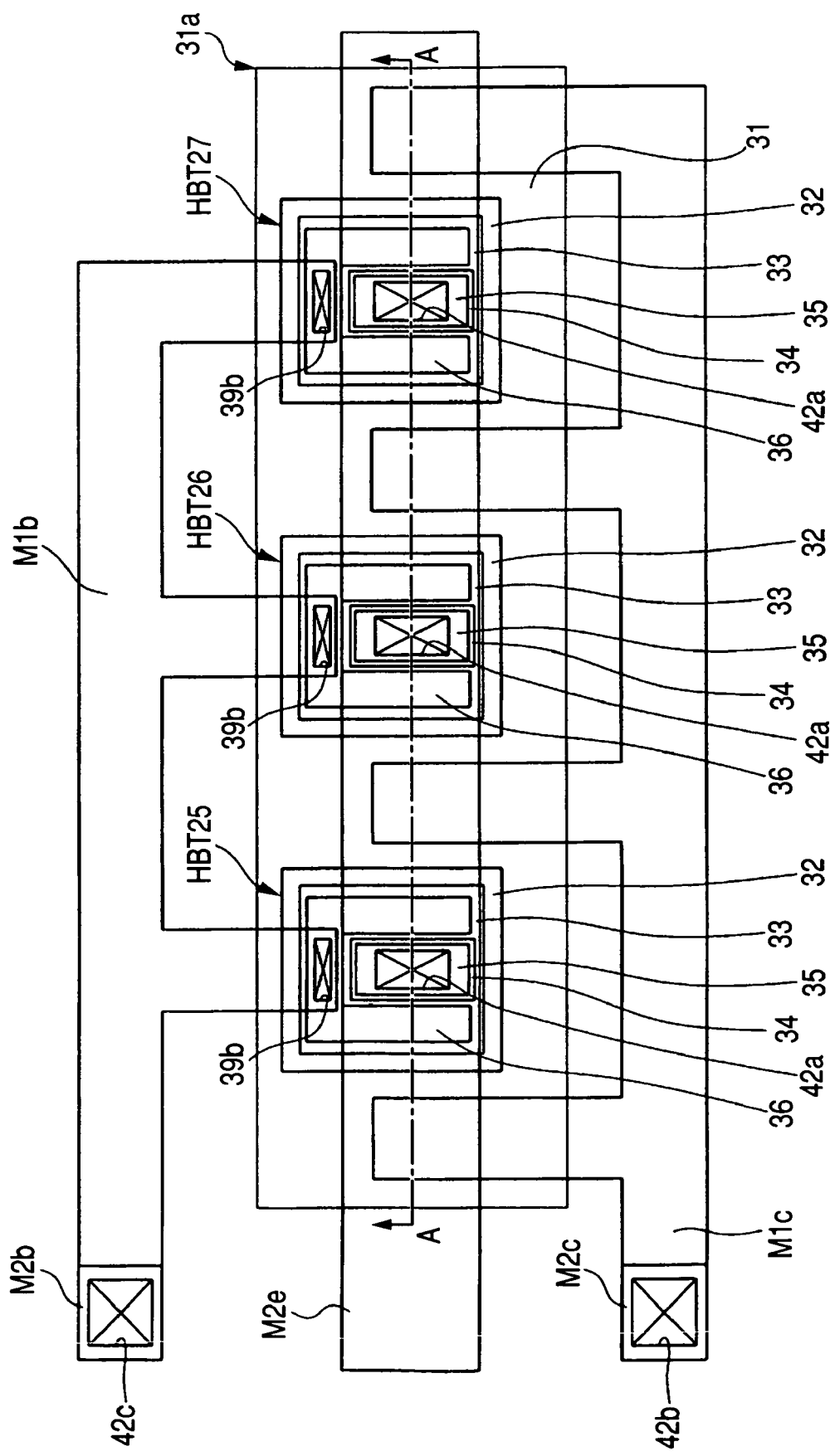
FIG. 9 is a plan view illustrating the way a plurality of the HBTs, the first wiring layer, and a second wiring layer are formed.

FIG. 9 is a plan view illustrating a state in which the HBT 25 to the HBT 27, first wiring layer, and second wiring layer are formed. As illustrated in FIG. 9, the emitter electrodes 35 of the HBT 25 to the HBT 27 are connected in common with emitter wiring M2*e* through connection holes 42*a* filled with conductive material. More specific description will be given. The emitter wiring M2*e* is extended in the direction in which the HBT 25 to the HBT 27 line up, and is connected with the individual emitter electrodes 35 through the connection holes 42*a* filled with conductive material. The emitter wiring M2*e* is formed in the second wiring layer positioned above the first wiring layer. The reason why the emitter wiring M2*e* is formed in the second wiring layer is that the emitter electrodes 35 are formed at a level higher than the base electrodes 36 and the collector electrodes 37. The first collector wiring M1*c* is connected with second collector wiring M2*c* through a connection hole 42*b* filled with conductive material; the first base wiring M1*b* is connected with second base wiring M2*b* through a connection hole 42*c* filled with conductive material. The second collector wiring M2*c* and the second base wiring M1*c* are formed in the second wiring layer.

Figure 10:
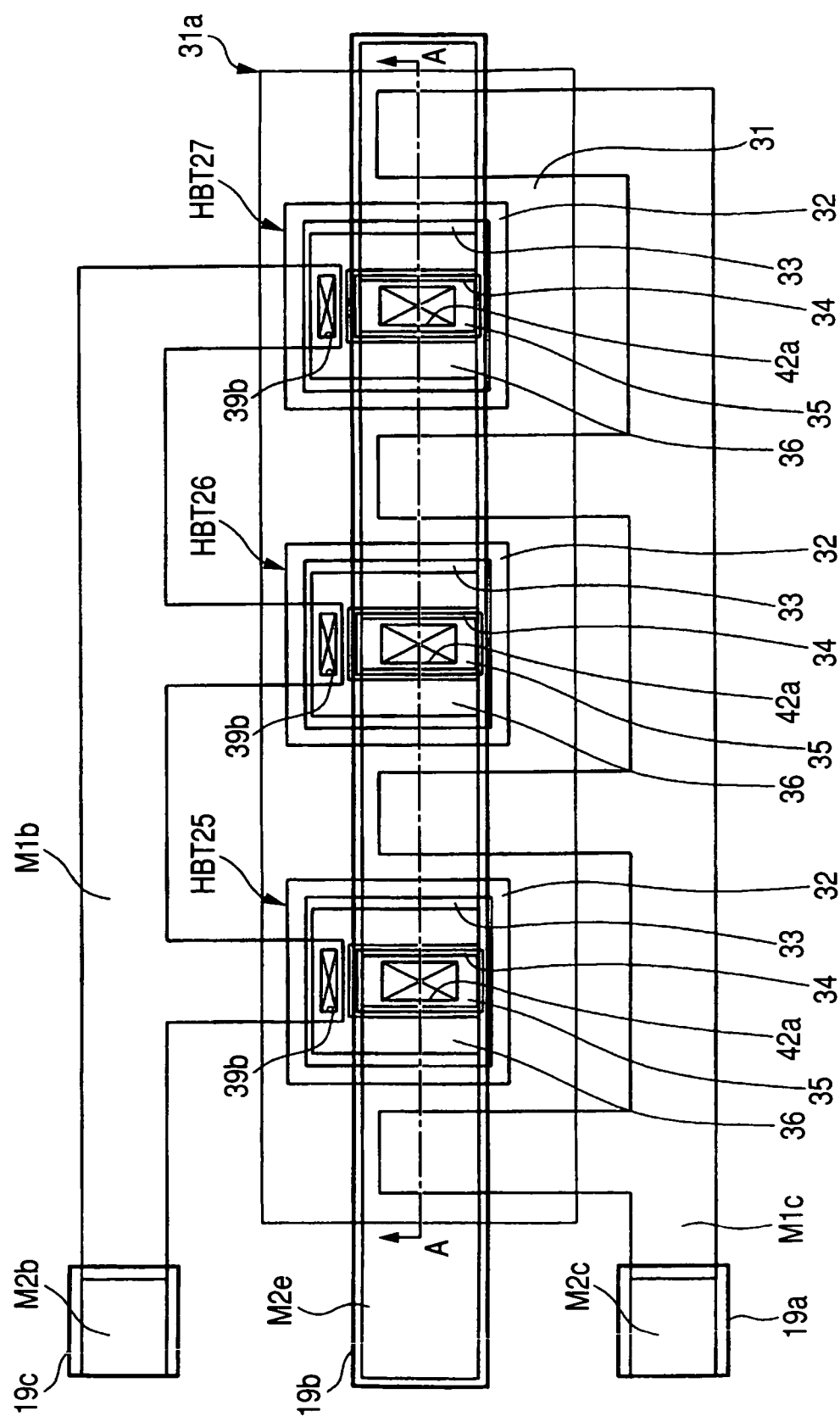
FIG. 10 is a plan view illustrating the way a plurality of the HBTs, the first wiring layer, the second wiring layer, and bump electrodes are formed.

FIG. 10 is a plan view illustrating a state in which the HBT 25 to the HBT 27, first wiring layer, second wiring layer, and third wiring layer (bump electrodes) are formed. As illustrated in FIG. 10, the emitter bump electrode 19*b* is formed directly on the emitter wiring M2*e* formed in the second wiring layer. The emitter bump electrode 19*b* is formed in the third wiring layer, and the third wiring layer is formed directly on the second wiring layer without connection holes between it and the second wiring layer.

The emitter bump electrode 19*b* is extended in the direction in which the HBT 25 to the HBT 27 line up, and is electrically connected with the emitter electrodes 35 through the emitter wiring M2*e* formed in the second wiring layer. Since the emitter wiring M2*e* and the emitter bump electrode 19*b* are extended in the predetermined direction, their heat capacities are enhanced. With the emitter wiring M2*e* and the emitter bump electrode 19*b* formed, therefore, heat produced in proximity to the emitter electrodes 35 is swiftly diffused to the emitter wiring M2*e* and the emitter bump electrode 19*b*. For this reason, the efficiency of radiation of heat produced in the HBT 25 to the HBT 27 can be enhanced.

The collector bump electrode 19*a* is formed directly on the second collector wiring M2*c*, and the base bump electrode 19*c* is formed directly on the second base wiring M2*b*. The collector bump electrode 19*a*, emitter bump electrode 19*b*, and base bump electrode 19*c* are formed in the same wiring layer, the third wiring layer. Therefore, the element formation surface of the first semiconductor chip 19 is planarized.

Figure 11:
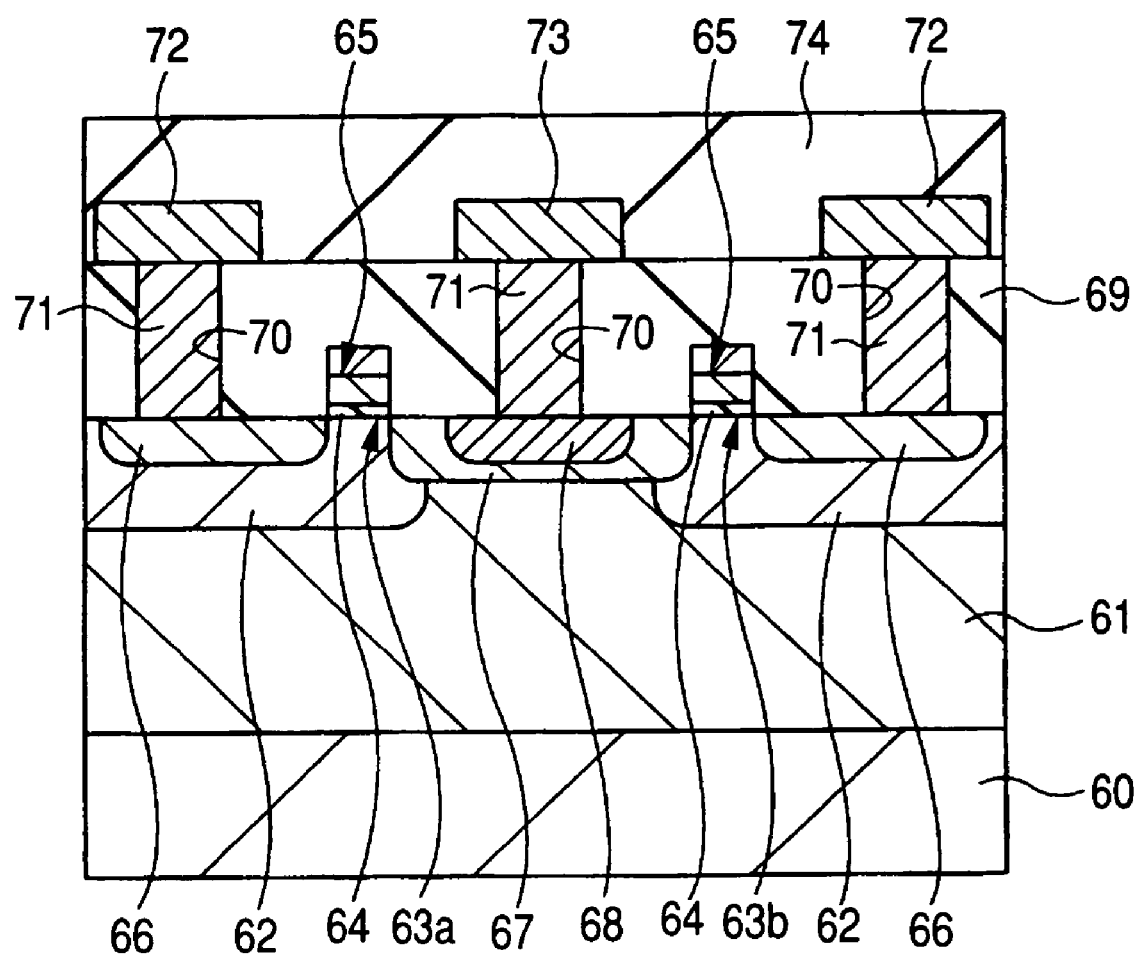
FIG. 11 is a sectional view illustrating the constitution of the second semiconductor chip.

A description will be given to the internal constitution of the second semiconductor chip 21. FIG. 11 is a drawing showing a section of the second semiconductor chip. In FIG. 11, a p$^-$-type semiconductor layer 61 is formed by an epitaxial method or the like over a semiconductor substrate 60 composed of p$^+$-type silicon (Si) single crystals. P-type wells 62 are formed in the semiconductor layer 61 by ion implantation of impurity such as boron (B).

n-channel-type LDMOSFETs (Laterally Diffused Metal Oxide Semiconductor Field Effect Transistors) 63*a* and 63*b* are formed over the principal surface of the semiconductor substrate 60. The gate insulating films 64 of the LDMOSFETs 63*a* and 63*b* comprise, for example, a thin silicon oxide film and the like, and is formed using, for example, thermal oxidation. The gate electrodes 65 of the LDMOSFETs 63*a* and 63*b* are formed, for example, by patterning a polycrystalline silicon film formed over the principal surface of the semiconductor substrate 60 by photolithography and etching. For example, a titanium silicide film and a cobalt silicide film are formed over the polycrystalline silicon film. Therefore, the gate electrode 65 is formed of a film stack of a polycrystalline silicon film and a metal silicide film. The channels of the LDMOSFETs 63*a* and 63*b* are formed in the p-type wells 62 positioned under the gate electrodes 65.

The n$^+$-type semiconductor regions 66 as the source regions of the LDMOSFETs 63*a* and 63*b* are formed in the p-type wells 62 so that they are extended to one-side ends of the gate electrodes 65. The drain regions of the LDMOSFETs 63*a* and 63*b* are formed in common between the adjoining gate electrodes 65. The drain regions of the LDMOSFETs 63*a* and 63*b* comprise an n$^-$-type semiconductor region 67 and an n$^+$-type semiconductor region 68 higher in impurity atom concentration than the n$^-$-type semiconductor region 67. The n$^-$-type semiconductor region 67 and the n$^+$-type semiconductor region 68 are respectively formed by ion implantation of n-type impurity such as phosphor (P).

An insulating film 69 comprising, for example, a silicon oxide film is formed over the principal surface of the semiconductor substrate 60 so that the gate electrodes 65 are covered therewith. Contact holes 70 that expose the surfaces of the n+-type semiconductor regions 66 and 68 are formed in the insulating film 69. The contact holes 70 are filled with plugs 71 comprising, for example, a barrier film and a tungsten film. Source electrodes 72 and a drain electrode 73 are formed over the insulating film 69. The source electrodes 72 are electrically connected with the n+-type semiconductor regions 66 through the plugs 71, and the drain electrode 73 is electrically connected with the n+-type semiconductor region 68 through the plug 71. The source electrodes 72 and the drain electrode 73 can be formed, for example, by patterning an aluminum alloy film formed over the insulating film 69 by photolithography and etching. The source electrodes 72 and the drain electrode 73 can also be formed of a film stack of a barrier film and an aluminum alloy film.

An insulating film 74 is formed over the insulating film 69 so that the source electrodes 72 and the drain electrode 73 are covered therewith. Other wiring layers or interlayer insulating films are formed over the insulating film 74 as required. In this specification, the description of such layers and films will be omitted. A plurality of the LDMOSFETs 63a and 63b illustrated in FIG. 11 are connected in parallel, and, for example, the amplifying portion of the amplifier 2a illustrated in FIG. 1 is thereby formed.

A description will be given to a manufacturing method for the power amplifier module (semiconductor device) in this embodiment.

Figure 12:
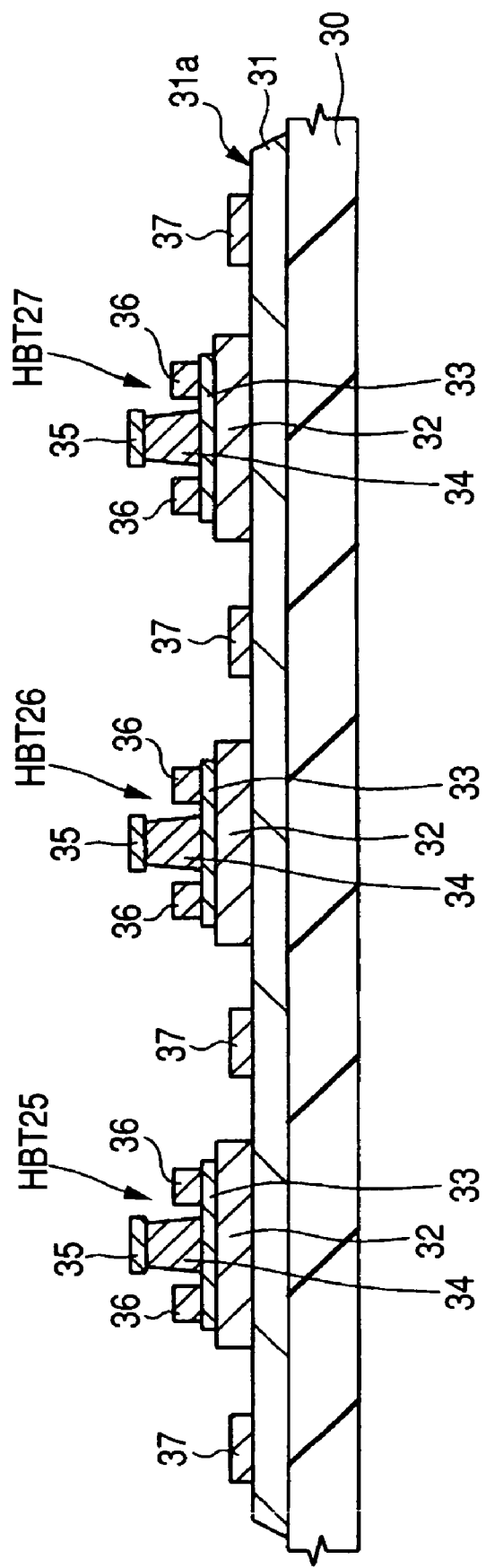
FIG. 12 is a sectional view illustrating the manufacturing process for the semiconductor device in this embodiment.

FIG. 12 is a sectional view taken along the line A-A of FIG. 7. As illustrated in FIG. 12, the sub collector layer 31 comprising an n+-type GaAs layer is formed over a semi-insulating GaAs substrate (semiconductor wafer) 30 by MOCVD (Metal Organic Chemical Vapor Deposition). The HBT 25 to the HBT 27 are formed in the respective chip regions present over the sub collector layer 31. Hereafter, brief description will be given to the process for forming the HBT 25 to the HBT 27.

A collector layer comprising an n-type GaAs layer and a base layer comprising a p-type GaAs layer are laminated and formed over the sub collector layer 31 using the MOCVD. An n-type InGaP layer, GaAs layer, and InGaAs layer are formed over the base layer in this order using the MOCVD.

Subsequently, for example, a tungsten silicide film as a conductive film is formed over the InGaAs layer. For example, sputtering can be used to form the tungsten silicide film. Thereafter, the tungsten silicide film is patterned using photolithography and etching to form the emitter electrodes 35.

Next, the n-type InGaAs layer, GaAs layer, and InGaP layer are etched in sequence using the emitter electrodes 35 as a mask to form the emitter layer 34. The base electrodes 36 formed of, for example, gold are formed over the exposed base layer.

Subsequently, the base mesas 33 are formed using photolithography and etching, and thereafter, the collector mesas 32 are formed. The collector electrodes 37 formed of, for example, gold are formed over the exposed sub collector layer 31. Thus, the HBT 25 to the HBT 27 can be formed. Finally, the mesa isolation 31a is formed for electrical isolation from other elements.

Figure 13:
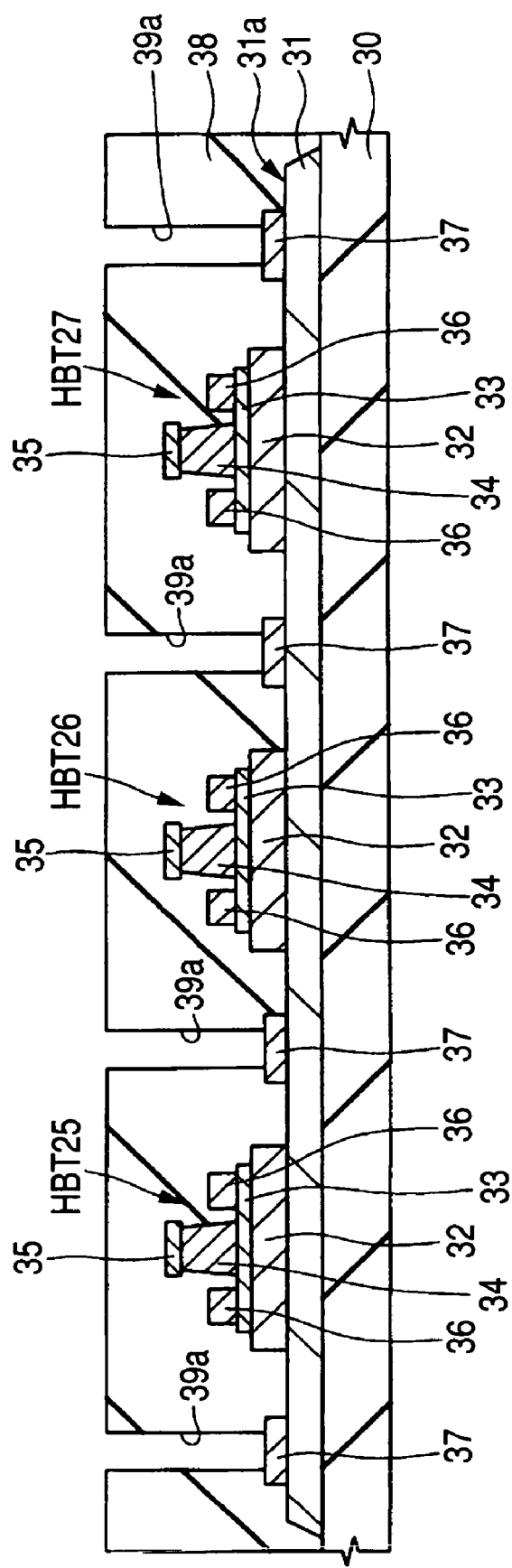
FIG. 13 is a sectional view illustrating the manufacturing process for the semiconductor device, following FIG. 12.

Next, an insulating film 38 is formed over the element formation surface of the GaAs substrate 30 with the HBT 25 to the HBT 27 formed thereover, as illustrated in FIG. 13. The insulating film 38 is formed of a laminated silicon oxide film using, for example, P-CVD (Plasma Chemical Vapor Deposition) and SOG (Spin On Glass) A more specific description will be given. In the SOG, the element formation surface of the GaAs substrate 30 is spin-coated with liquid obtained by dissolving silica in solvent such as alcohol, and thereafter evaporating the solvent by heat treatment. Thus, a silicon oxide film to be the insulating film 38 is formed.

Subsequently, the connection holes 39a are formed in the insulating film 38 using photolithography and etching. The connection holes 39a are so formed that the insulating film 38 is opened above the collector electrodes 37, and thus the collector electrodes 37 are exposed at the bottom of the connection holes 39a. At this time, the connection holes 39b that penetrate the insulating film 38 to the base electrodes 36 are also formed though the connection holes 39b are not depicted in FIG. 13.

Figure 14:
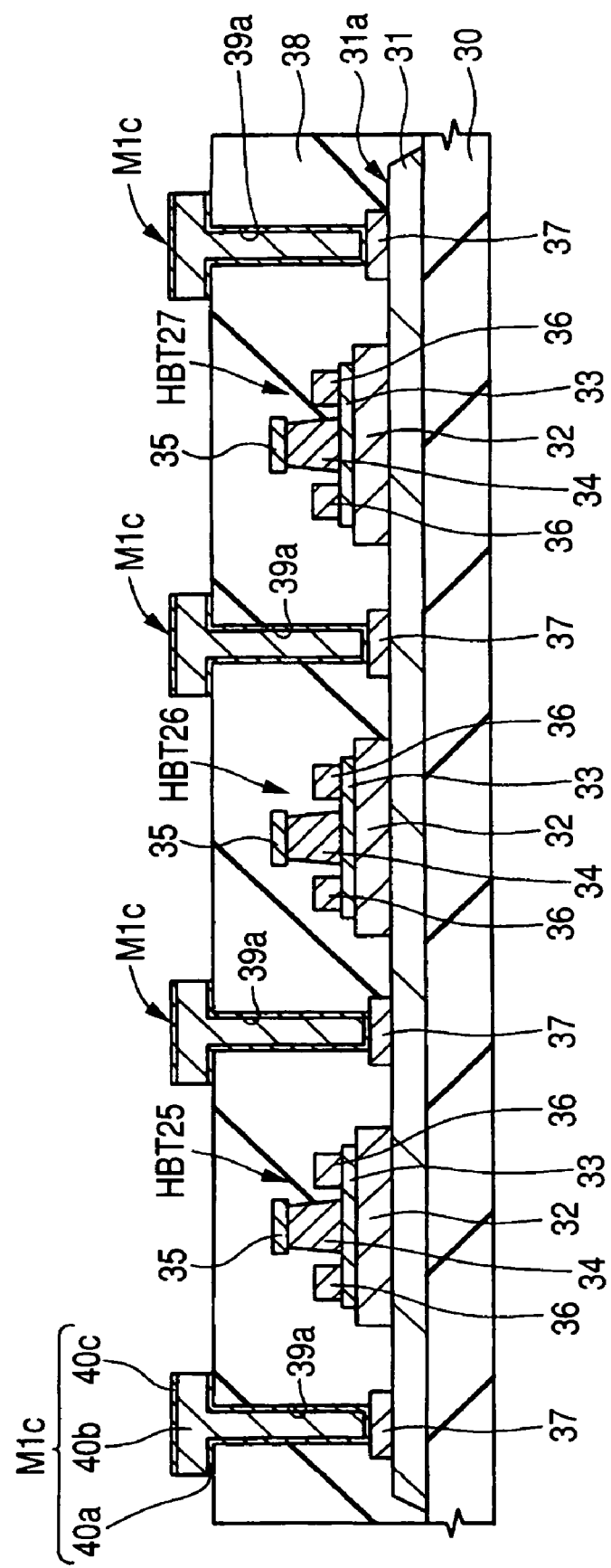
FIG. 14 is a sectional view illustrating the manufacturing process for the semiconductor device, following FIG. 13.

FIG. 14 is a sectional view taken along the line A-A of FIG. 8. As illustrated in FIG. 14, a molybdenum film 40a, gold film 40b, and molybdenum film 40c are formed in this order over the insulating film 38 including the interior of the connection holes 39a. At this time, plating and photolithography are used. Thus, the first collector wiring M1c is formed. The first collector wiring M1c is formed in the first wiring layer and is connected in common with the individual collector electrodes 37. The first base wiring M1b is also formed over the insulating film 38 including the connection holes 39b though it is not depicted in FIG. 14 (Refer to FIG. 8). The first collector wiring M1c and the first base wiring M1b may be formed using, for example, sputtering.

Figure 15:
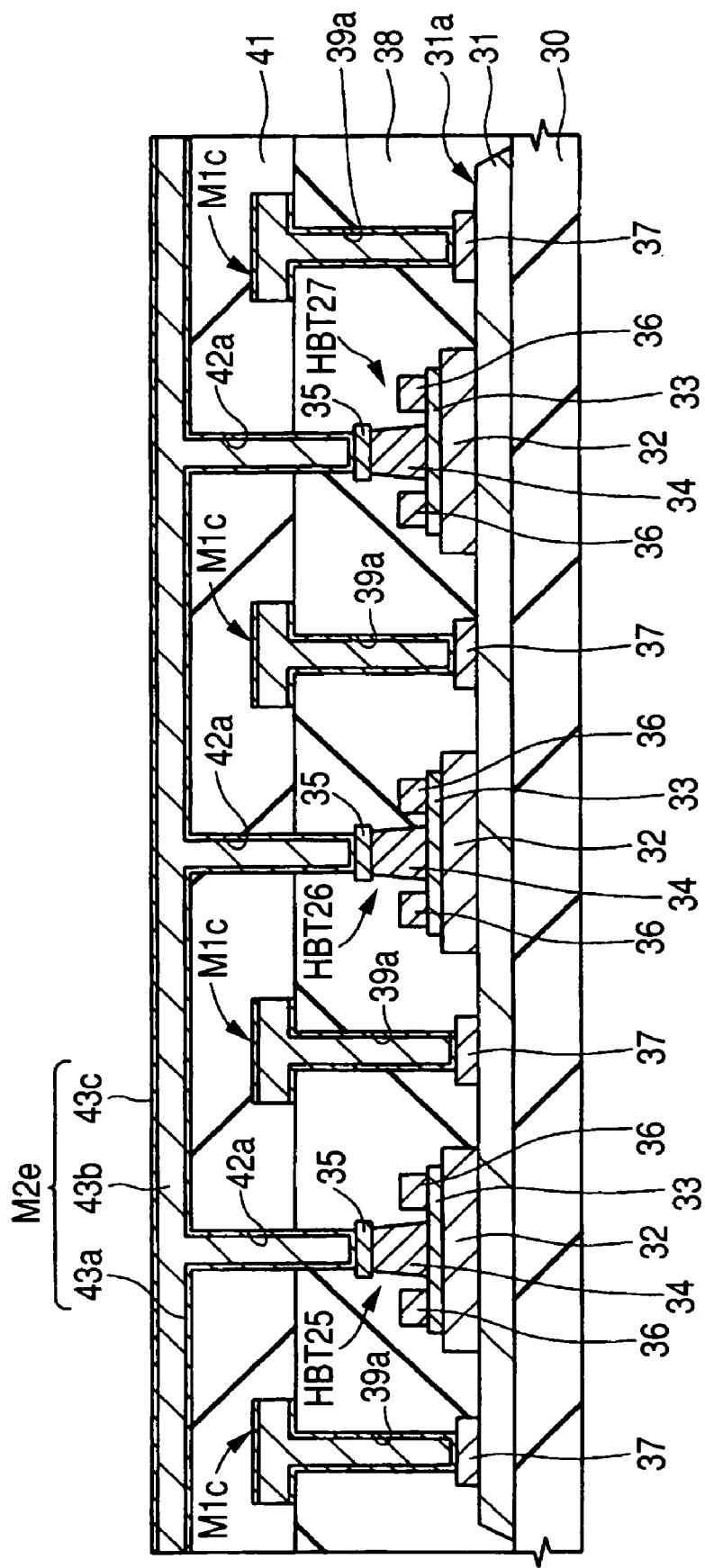
FIG. 15 is a sectional view illustrating the manufacturing process for the semiconductor device, following FIG. 14.

FIG. 15 is a sectional view taken along the line A-A of FIG. 9. As illustrated in FIG. 15, an insulating film 41 is formed over the insulating film 38 with the first collector wiring M1c formed thereover. For example, similarly with the insulating film 38, the insulating film 41 is formed of a laminated silicon oxide film using the P-CVD and the SOG. Using photolithography and etching, the connection holes 42a extended to the emitter electrodes 35 are formed in the insulating film 38 and the insulating film 41. As this time, the connection hole 42b extended to the first collector wiring M1c and the connection hole 42c extended to the first base wiring M1b are also formed as illustrated in FIG. 9.

Next, using plating and photolithography, a molybdenum film 43a, a gold film 43b, and a molybdenum film 43c are formed in this order over the insulating film 41 including the interior of the connection holes 42a, as illustrated in FIG. 15. Thus, the emitter wiring M2e is formed. This emitter wiring M2e is extended in the direction in which the HBT 25 to the HBT 27 line up, and is connected in common with the individual emitter electrodes 35. The emitter wiring M2e is formed in the second wiring layer. As illustrated in FIG. 9, the second collector wiring M2c is formed over the first collector wiring M1c through the connection hole 42b filled with conductive material; the second base wiring M2b is formed over the first base wiring M1b through the connection hole 42c filled with conductive material. However, the foregoing is not depicted in FIG. 15. The second collector wiring M2c and the second base wiring M2b are also formed in the second wiring layer. The emitter wiring M2e, second collector wiring M2c, and second base wiring M2b may be formed using sputtering or the like, not plating.

Figure 16:
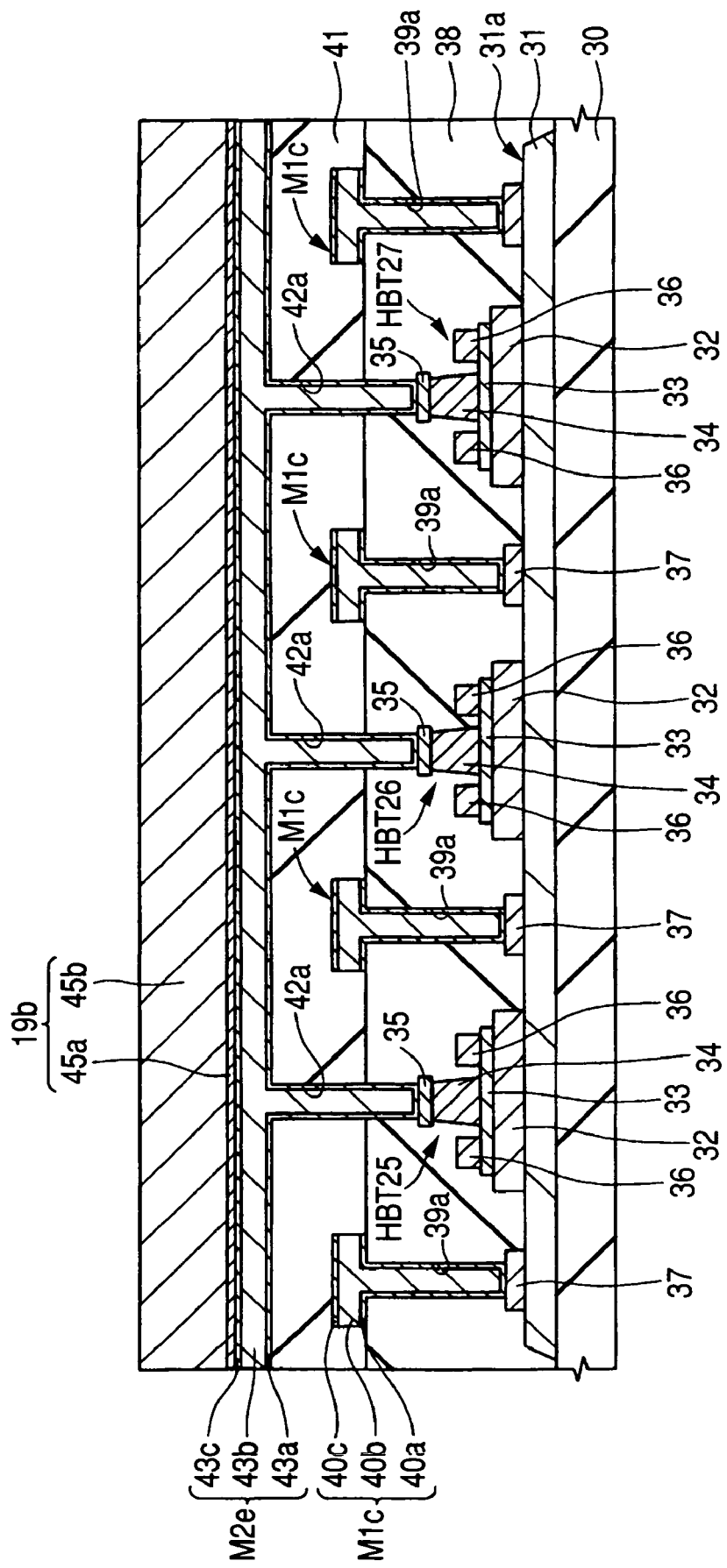
FIG. 16 is a sectional view illustrating the manufacturing process for the semiconductor device, following FIG. 15.

FIG. 16 is a sectional view taken along the line A-A of FIG. 10. First, a silicon nitride film (not shown) to be a passivation film is formed over the insulating film 41 including the emitter wiring M2e. Thereafter, using photolithography and etching, the silicon nitride film is patterned. This patterning is carried out so that the silicon nitride film is opened to a bump electrode formation region. Subsequently, a molybdenum/gold film 45a composed of molybdenum and gold is formed in the region including the area above the emitter wiring M2e using, for example, sputtering, as illustrated in FIG. 16. Thereafter, using photolithography and plating, a gold film 45$b$ is formed over the molybdenum/gold film 45$a$ to form the emitter bump electrode 19$b$. This emitter bump electrode 19$b$ is so formed that it includes the emitter wiring M2$e$ extended in the direction in which the HBT 25 to the HBT 27 line up. Therefore, the emitter bump electrode 19$b$ is so formed that it is extended in the direction in which the HBT 25 to the HBT 27 line up. When the emitter bump electrode 19$b$ is formed, the collector bump electrode 19$a$ and the base bump electrode 19$c$, illustrated in FIG. 10, are also formed.

Next, the GaAs substrate 30 is cut and separated into individual semiconductor chips. Each semiconductor chip cut at this time becomes, for example, the first semiconductor chip 19 illustrated in FIG. 6. Subsequently, first semiconductor chips 19 are mounted over a substrate having multiple segments with a plurality of wiring substrates 10, illustrated in FIG. 5, formed therein. Mounting of the first semiconductor chip 19 over each wiring substrate 10 in the substrate having multiple segments is carried out so that the following is implemented: the emitter bump electrodes 19$b$ and 19$e$ formed in the first semiconductor chip 19 are connected with a plurality of the via holes, 18 formed in the wiring substrate 10, embraced therein. A plurality of these via holes 18 are connected with the external wiring for GND (ground level voltage supply) 12 formed over the underside surface of the wiring substrate 10 illustrated in FIG. 3.

Subsequently, the second semiconductor chip 21 is mounted over the first semiconductor chip 19 mounted over each wiring substrate 10, as illustrated in FIG. 4. Thereafter, the second semiconductor chip 21 and the wiring substrate 10 are connected with each other through the wires 22. The component mounting surface of the substrate having multiple segments is sealed with resin, and the substrate is cut and separated into individual wiring substrates 10. Thus, the power amplifier module A illustrated in FIG. 2 can be formed.

In the power amplifier module A in this embodiment, the emitter bump electrodes 19$b$ and 19$e$, extended in the predetermined direction, are connected with the external wiring for GND (ground level voltage supply) 12 through a plurality of the via holes 18. For this reason, heat produced in the HBT 25 to the HBT 27 is radiated as follow: the heat is conducted to the emitter bump electrodes 19$b$ and 19$e$ extended in the direction in which the HBT 25 to the HBT 27 line up. Thereafter, the heat passes through a plurality of the via holes 18, and is radiated at the external wiring for GND (ground level voltage supply) 12. Thus, heat is radiated through a plurality of the via holes 18; therefore, the heat radiation efficiency can be enhanced.

The power amplifier module A in this embodiment is so constructed that the first semiconductor chip 19 and the second semiconductor chip 21 are stacked together. Therefore, the power amplifier module A can be reduced in size.

Figure 17:
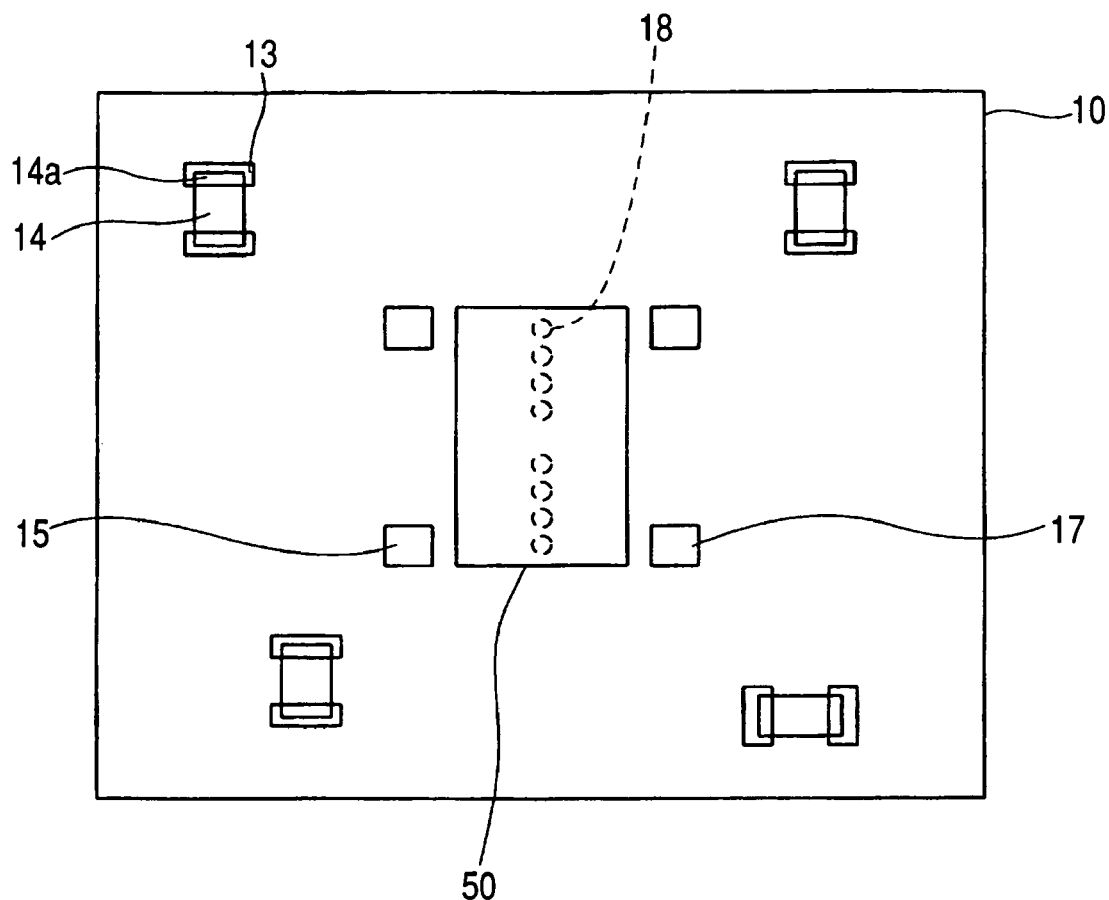
FIG. 17 is a plan view illustrating a modification to the embodiment, showing the principal surface of the wiring substrate.

This embodiment is so constructed that the emitter bump electrode 19$b$ and the emitter bump electrode 19$e$ in the first semiconductor chip 19 are connected with a plurality of different via holes 18 on the mounting surface of the wiring substrate 10. Instead, for example, the constitution illustrated in FIG. 17 may be adopted. In this constitution, wiring 50 is provided so that it embraces the connecting faces of all the via holes 18 on the mounting surface of the wiring substrate 10; and the first semiconductor chip 19 is mounted so that the emitter bump electrodes 19$b$ and 19$e$ are embraced in the wiring 50. With this constitution, for example, heat that is conducted by the emitter bump electrode 19$b$ is conducted to the external wiring for GND (ground level voltage supply) 12 through more via holes 18 than in this embodiment. Therefore, the heat radiation efficiency can be enhanced. A more specific description will be given. In this embodiment, the emitter bump electrode 19$b$ is connected with four via holes 18 on the mounting surface, as illustrated in FIG. 3. If the first semiconductor chip 19 is connected with the wiring substrate 10 illustrated in FIG. 17, the emitter bump electrode 19$b$ is connected with eight via holes on the mounting surface; therefore, the heat radiation efficiency can be enhanced. Especially, the emitter bump electrode 19$b$ is positioned in a circuit for the GSM, for example, and the emitter bump electrode 19$e$ is positioned in a circuit for the DCS, for example. Therefore, when one circuit is used, the other circuit is not used. As a result, the following advantage is brought: when, for example, the circuit for the GSM is used and the emitter bump electrode 19$b$ produces heat, this heat can be efficiently conducted to the external electrode for GND (ground level voltage supply) 12 using the via holes positioned on the emitter bump electrode 19$e$ side as well.

Figure 18:
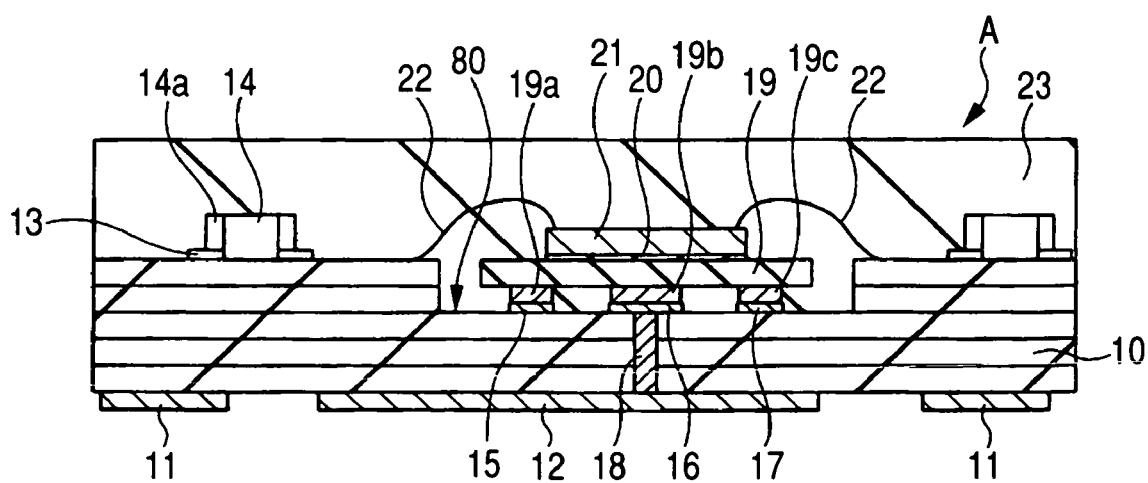
FIG. 18 is a sectional view illustrating a modification to the embodiment, showing the constitution of the power amplifier module.

The following constitution illustrated in FIG. 18 may be adopted: a dent referred to as cavity 80 is formed in the principal surface of the wiring substrate 10, and the first semiconductor chip 19 with the HBTs formed therein is mounted in this cavity 80. At this time, the collector bump electrode 19$a$, emitter bump electrode 19$b$, and base bump electrode 19$c$ of the first semiconductor chip 19 are connected with wiring 15 to wiring 17 formed in the cavity 80. The wiring 16 connected with the emitter bump electrode 19$b$ is connected with the external wiring for GND (ground level voltage supply) 12, formed over the underside surface of the wiring substrate 10, through the via holes 18.

By providing the cavity 80 in the wiring substrate 10, as mentioned above, the distance between the emitter bump electrode 19$b$ and the external wiring for GND (ground level voltage supply) 12 can be shortened as compared with cases where the cavity 80 is not provided. A more specific description will be given. Provision of the cavity 80 shortens the length of the via holes 18, and the external wiring for GND (ground level voltage supply) 12 provided with functions of supplying GND (ground level voltage supply) voltage and radiating heat and the emitter bump electrode 19$b$ are brought close to each other. Therefore, the efficiency of radiation of heat produced in the first semiconductor chip 19 can be enhanced.

Up to this point, the invention made by the present inventors has been specifically described based on the embodiment. However, the present invention is not limited to this embodiment, and it will be obvious that various changes may be made without departing from the scope of the invention, needless to add.

With respect to this embodiment, description has been given to npn bipolar transistors. Instead, the present invention may be applied to pnp bipolar transistors. Description has been given to bipolar transistors formed over a GaAs substrate. Instead, other compound semiconductors may be used.

With respect to this embodiment, description has been given to cases where a GaAs substrate is used and an InGaP layer is included as an emitter layer. Instead, the present invention may be applied to HBTs that use a GaAs substrate and contain AlGaAs (aluminum gallium arsenide) as an emitter layer.

The present invention can be used in a broad range of applications in the manufacturing industry in which semiconductor devices are manufactured.

What is claimed is:

1. A semiconductor device comprising:
a first semiconductor chip including:
(a1) a plurality of heterojunction bipolar transistors, and
(a2) an emitter bump electrode that is connected in common with the emitter electrodes of a plurality of the heterojunction bipolar transistors and is extended in a predetermined direction; and (b) a wiring substrate over which the first semiconductor chip is mounted, wherein the emitter bump electrode is connected with a plurality of via holes so formed that the via holes penetrate the wiring substrate; and wherein a second semiconductor chip lower in heat dissipation value than the first semiconductor chip is disposed over a surface of the first semiconductor chip opposite a surface that faces toward the wiring substrate when the first semiconductor chip is mounted over the wiring substrate.

2. The semiconductor device according to claim 1, wherein the first semiconductor chip is formed with compound semiconductor as a main ingredient, and the second semiconductor chip is formed with silicon as a main ingredient.

3. The semiconductor device according to claim 1, wherein the semiconductor device is a power amplifier module used in a cellular phone.

4. The semiconductor device according to claim 1, comprising:

multistage amplifier circuits that amplify input signals and a control circuit that controls the multistage amplifier circuits, wherein, of the multistage amplifier circuits, the amplifier circuit in the first stage and the control circuit are formed in the second semiconductor chip, and of the multistage amplifier circuits, the amplifier circuit including the heterojunction bipolar transistor in a last stage are formed in the first semiconductor chip.

5. The semiconductor device according to claim 1, comprising:

three-staged amplifier circuits that amplify input signals and a control circuit that controls the three-staged amplifier circuits, wherein, of the three-staged amplifier circuits, the amplifier circuit in the first stage and the control circuit are formed in the second semiconductor chip, and of the three-staged amplifier circuits, the amplifier circuits in the second stages and the amplifier circuits including the heterojunction bipolar transistors in the last stages are formed in the first semiconductor chip.

6. The semiconductor device according to claim 1, comprising:

a first circuit that operates with a first frequency and a second circuit that operates with a second frequency.

7. The semiconductor device according to claim 6, wherein the first circuit and the second circuit include multistage amplifier circuits that amplify input signals respectively inputted to the first circuit and the second circuit, and wherein the first-stage amplifier circuit in the first circuit and the first-stage amplifier circuit in the second circuit are formed in the second semiconductor chip, and the last-stage amplifier circuit in the first circuit and the last-stage amplifier circuit in the second circuit are formed in the first semiconductor chip.

8. The semiconductor device according to claim 1, wherein the first semiconductor chip comprises:

(a3) a first base wiring connected in common with base electrodes of a plurality of the heterojunction bipolar transistors;

(a4) a first collector wiring connected in common with collector electrodes of a plurality of the heterojunction bipolar transistors; and (a5) an emitter wiring connected in common with emitter electrodes of a plurality of the heterojunction bipolar transistors, and wherein the first base wiring and the first collector wiring are formed in a first wiring layer, the emitter wiring is formed in a second wiring layer, and the emitter bump electrode formed on the emitter wiring is formed in a third wiring layer.

9. The semiconductor device according to claim 8, further comprising:

(a6) a second base wiring formed over the first base wiring;

(a7) a base bump electrode formed over the second base wiring;

(a8) a second collector wiring formed over the first collector wiring; and (a9) a collector bump electrode formed over the second collector wiring, wherein the second base wiring and the second collector wiring are formed in the second wiring layer, and the base bump electrode and the collector bump electrode are formed in the third wiring layer.

10. The semiconductor device according to claim 1, wherein the wiring substrate has a wiring that is so formed that connecting faces of a plurality of the via holes are embraced therein and is formed on the surface of the wiring substrate over which the first semiconductor chip is mounted, and wherein the first semiconductor chip is mounted over the wiring substrate so that a plurality of the emitter bump electrodes are embraced in the wiring.

11. The semiconductor device according to claim 1, wherein the first semiconductor chip is mounted with a surface with a plurality of the heterojunction bipolar transistors formed therein facing toward the wiring substrate.

12. The semiconductor device according to claim 11, wherein the via holes in the semiconductor device are formed of metal, wherein an external wiring for ground level voltage supply is formed over the surface of the wiring substrate opposite the surface over which the first semiconductor chip is mounted, and wherein the via holes are connected with the external wiring for ground level voltage supply.

13. The semiconductor device according to claim 4, wherein passive components are mounted over the wiring substrate.

14. The semiconductor device according to claim 1, wherein the second semiconductor chip and the wiring substrate are electrically connected with each other through wires.

15. A semiconductor device comprising:

a first semiconductor chip including:

(a1) a plurality of heterojunction bipolar transistors, and (a2) an emitter bump electrode that is connected in common with emitter electrodes of a plurality of the heterojunction bipolar transistors and is extended in a predetermined direction;

(b) a second semiconductor chip lower in heat dissipation value than the first semiconductor chip; and (c) a wiring substrate over which the first semiconductor chip and the second semiconductor chip are mounted, wherein the first semiconductor chip is mounted over the wiring substrate so that the emitter bump electrode is connected with a plurality of via holes penetrating the wiring substrate, and the second semiconductor chip is mounted over a surface of the first semiconductor chip opposite a surface that surface toward the wiring substrate when the first semiconductor chip is mounted over the wiring substrate.

16. A semiconductor device comprising:
(a) a wiring substrate having via holes;
(b) a first semiconductor chip in which heterojunction bipolar transistors are formed; and
(c) a second semiconductor chip lower in heat dissipation value than the first semiconductor chip,
wherein the first semiconductor chip is mounted over the wiring substrate so that the first semiconductor chip is connected with the via holes, and the second semiconductor chip is disposed over a surface of the first semiconductor chip opposite a mounting surface of the first semiconductor chip.

* * * * *